United States Patent
Stemmer

(10) Patent No.: US 10,012,713 B2
(45) Date of Patent: Jul. 3, 2018

(54) METHOD AND DEVICE FOR DETERMINATION OF A MAGNETIC RESONANCE CONTROL SEQUENCE

(71) Applicant: Siemens Aktiengesellschaft, Munich (DE)

(72) Inventor: Alto Stemmer, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 976 days.

(21) Appl. No.: 14/446,722

(22) Filed: Jul. 30, 2014

(65) Prior Publication Data

US 2015/0035531 A1    Feb. 5, 2015

(30) Foreign Application Priority Data

Jul. 30, 2013    (DE) .................. 10 2013 214 867

(51) Int. Cl.
*G01R 33/483* (2006.01)
*G01R 33/565* (2006.01)
*G01R 33/54* (2006.01)
*G01R 35/00* (2006.01)
*G01R 33/48* (2006.01)

(52) U.S. Cl.
CPC ..... *G01R 33/4836* (2013.01); *G01R 33/4824* (2013.01); *G01R 33/543* (2013.01); *G01R 33/56572* (2013.01); *G01R 35/005* (2013.01)

(58) Field of Classification Search
CPC ........... G01R 33/4824; G01R 33/4833; G01R 33/4836; G01R 33/543; G01R 35/005
USPC ......... 324/307, 309, 318, 319, 322; 382/131
See application file for complete search history.

(56) References Cited

U.S. PATENT DOCUMENTS

| 4,727,325 A | 2/1988 | Matsui et al. |
| 4,812,760 A | 3/1989 | Bottomley et al. |
| 5,532,595 A | 7/1996 | Lampman et al. |

(Continued)

FOREIGN PATENT DOCUMENTS

| CN | 102283649 A | 12/2011 |
| JP | S6288948 A | 4/1987 |

(Continued)

OTHER PUBLICATIONS

Pauly et al: "A k-space analysis of small-tip angle excitation", J. Magn. Reson. vol. 81, pp. 43-56, (1989).

(Continued)

*Primary Examiner* — Rishi Patel
(74) *Attorney, Agent, or Firm* — Schiff Hardin LLP

(57) ABSTRACT

A magnetic resonance control sequence with a pulse arrangement that acts selectively in at least two spatial directions in order to excite a limited rotationally symmetrical excitation profile within an examination subject has an RF excitation pulse formed as a sequence of multiple partial RF pulses, and gradient pulses in the two spatial directions that are coordinated with the partial RF pulses so that the RF energy introduction of different partial RF pulses in transmission k-space occurs on circular k-space transmission trajectories that are concentric to one another. The amplitude of the RF envelope of the partial RF pulses is constant during the duration of a traversal of each circular k-space trajectory. The control sequence can also be used in a calibration of a magnetic resonance system.

12 Claims, 15 Drawing Sheets

(56) References Cited

U.S. PATENT DOCUMENTS

| | | | |
|---|---|---|---|
| 5,578,921 | A | 11/1996 | Morrell |
| 6,288,545 | B1 | 9/2001 | King et al. |
| 7,466,131 | B1 * | 12/2008 | Xu .................... G01R 33/4824 |
| | | | 324/318 |
| 2002/0130660 | A1 | 9/2002 | Thesen |
| 2005/0004448 | A1 | 1/2005 | Gurr et al. |
| 2005/0174114 | A1 * | 8/2005 | Mugler, III ........ G01R 33/5613 |
| | | | 324/309 |
| 2007/0013374 | A1 | 1/2007 | Griswold et al. |
| 2010/0079141 | A1 | 4/2010 | Stemmer |
| 2011/0241675 | A1 | 10/2011 | Constable et al. |
| 2012/0019247 | A1 * | 1/2012 | Boernert ............. G01R 33/288 |
| | | | 324/309 |
| 2012/0146641 | A1 | 6/2012 | Wu et al. |
| 2012/0293172 | A1 | 11/2012 | Wheaton et al. |
| 2013/0271133 | A1 * | 10/2013 | Snyder .................. G01R 33/56 |
| | | | 324/309 |
| 2015/0260815 | A1 * | 9/2015 | Nishihara .......... G01R 33/4836 |
| | | | 324/309 |

FOREIGN PATENT DOCUMENTS

| | | |
|---|---|---|
| JP | H119571 A | 1/1999 |
| WO | WO-2004/008169 A1 | 1/2004 |

OTHER PUBLICATIONS

Hardy. et al.: "Correcting for Nonuniform k-Space Sampling in Two-Dimensional NMR Selective Excitation", Journal of Magnetic Resonance vol. 87,pp. 639-645, (1990).

Börnert et al: "On spatially selective RF excitation and its analogy with spiral MR image acquisition"; Magnetic Resonance Materials in Physics, Biology and Medicine vol. 7, pp. 166-178,( 1998).

Wu et al: "MRI Using a Concentric Rings Trajectory"; Magnetic Resonance in Medicine vol. 59:pp. 102-112 (2008).

Schröder et al: "Spatial Excitation Using Variable-Density Spiral Trajectories", Journal of Magnetic Resonance Imaging vol. 18, pp. 136-141, (2003).

Ramanna S. et al; "Single-Shot 3D GRASE with Cylindrical k-Space Trajectories"; Magnetic Resonance in Medicine; vol. 60; pp. 976-980; (2008).

* cited by examiner

METHOD AND DEVICE FOR DETERMINATION OF A MAGNETIC RESONANCE CONTROL SEQUENCE

BACKGROUND OF THE INVENTION

Field of the Invention

The invention concerns a method to determine a magnetic resonance control sequence with a pulse arrangement that acts selectively in at least two spatial directions in order to excite a limited, rotationally symmetrical excitation profile within an examination subject. Moreover, the invention concerns a method to operate a magnetic resonance system with such a magnetic resonance control sequence; a method to calibrate a magnetic resonance system using such a method; a control sequence determination device in order to determine such a magnetic resonance control sequence; and a magnetic resonance system with such a control sequence determination device.

Description of the Prior Art

In a magnetic resonance tomography system (also called a magnetic resonance system), the body to be examined is typically exposed to a relatively high, optimally homogeneous basic magnetic field ($B_0$ field)—for example of 1, 5, 3 or 7 Tesla—with the use of a basic field magnet system. A magnetic field gradient is additionally applied by a gradient system. Radio-frequency excitation signals (RF signals, or also called RF excitation pulses or just RF pulses) are then emitted by suitable antenna devices via a radio-frequency transmission system, which causes the nuclear spins of specific atoms to be excited to resonance by a defined "flip angle" i.e., the spins are deflected relative to the magnetic field lines of the basic magnetic field. Upon relaxation of the nuclear spins, RF signals (magnetic resonance signals) are radiated that are received by suitable reception antennas and then are processed further. Finally, the desired image data are reconstructed from the raw data acquired in such a manner.

For a defined measurement, a pulse sequence is to be emitted that includes a radio-frequency pulse sequence to be emitted and a gradient pulse sequence to be (switched) activated in coordination with the RF pulse sequence (with time-coordinated gradient pulses in the slice selection direction, in the phase coding direction, and in the readout direction). In particular, the timing within the sequence—i.e. in what time intervals which pulses follow one another—is significant for the imaging. A number of control parameter values are normally defined in what is known as a measurement protocol, which is created in advance and retrieved (from a memory, for example) for a defined measurement, and can be modified as necessary by the operator on site, who can provide additional control parameter values, for example a defined slice spacing of a stack of slices to be measured, a slice thickness, etc. A magnetic resonance control sequence or pulse sequence is then calculated on the basis of all of these control parameter values.

In conventional procedures, the acquisition of images of the inside of the subject takes place slice-by-slice. A relatively thin, planar slice—typically between 1 and 10 mm—is selectively excited. Such a selective excitation is achieved by activating a gradient in the slice selection direction in coordination with the radio-frequency excitation pulse. Such a pulse arrangement, composed of the exciting radio-frequency pulse and the associated gradient, causes the resonance condition to be satisfied only in a slice orthogonal to the slice selection direction. The thickness of the excited slice in the slice selection direction is determined by the amplitude of the slice selection gradient and the frequency bandwidth of the radio-frequency pulse. The excited slice can be displaced (shifted) along the slice selection direction by a "shift" (a displacement) of the carrier frequency of the radio-frequency field. The selection volume of these one-dimensional, selective RF pulses is limited only in the direction orthogonal to the slice plane. This slice selection direction often proceeds parallel to what is known as the z-axis (the longitudinal axis of the tomography scanner), and thus also parallel to the longitudinal axis of a patient lying in the scanner. A spatial coding within the slice then takes place by a phase coding in one direction (most often the y-direction) and a readout coding in the second direction (most often the x-direction). In this way, a two-dimensional spatial frequency domain (known as k-space) in which the raw data are entered, is filled. An image of the slice is created from the data entered into k-space by a two-dimensional Fourier transformation thereof.

Moreover, multidimensional selective RF pulses are known. For example, a two-dimensional selective RF pulse can select (selectively excited nuclear spins in) a long rod or cylinder that is spatially limited in both directions orthogonal to the rod axis, thus in the radial direction orthogonal to the cylinder axis. For example, a three-dimensional selective RF pulse can excite a single voxel that is limited in all three spatial directions.

One important application of these multidimensional RF pulses is known as "inner volume imaging". A multidimensional RF pulse is used as an excitation pulse. Its limited excitation volume allows the field of view ("FoV") to be chosen smaller than the examination subject, without aliasing artifacts being created. A second important application is known as the "navigator technique". Here, for example, a cylindrical rod is excited with a two-dimensional selective RF pulse (known as a pencil beam excitation) through the diaphragm edge, and information for the detection of the breathing movement is subsequently read one-dimensionally along the cylinder axis. The excitation of the cylindrical rod and the data acquisition for this purpose take place repeatedly in different time segments within an imaging sequence in order to identically associate the data acquisition with gates, matching the movement, or in order to associate the raw data, or the image data reconstructed therefrom with a movement phase or position, and/or to correct the data.

A two-dimensional selective RF pulse or pulse arrangement is achieved by activating temporally varying selection gradients (i.e. matching gradient pulses) along the two selective directions of the RF pulse during the RF radiation. These selection gradients describe a trajectory in transmission k-space, which is designated in the following as a "transmission k-space trajectory", or just as a "trajectory". This transmission k-space trajectory determines in which k-space regions the RF energy is deposited (distributed) for excitation. Because the phase and envelope (amplitude) of the $B_1$ field of the RF pulse are selected as a function of time, matching the selected trajectory through transmission k-space, a precisely defined spatial selection volume (also designated as an "excitation profile") can be realized in the image domain (i.e. in geometric space).

In practice, only EPI trajectories (corresponding to the readout gradients in the echoplanar technique, abbreviated as EPI for "echoplanar imaging") and spiral trajectories (likewise known from the readout gradients) are used. EPI trajectories are thereby preferably used for the inner volume imaging, and spiral trajectories are primarily used for pencil beam excitations.

A practical problem in the realization of multidimensional RF pulses is known as gradient delay times. These delay times lead to a time deviation between the intended gradient shape and the actual applied gradient field. The simultaneously radiated, temporally varying RF pulse shape is therefore not matched to the gradient field, and this leads to a distortion and deviation from the desired excitation volume. The cause of these delay times is system imperfections of the gradient coil system and additional gradient fields induced by eddy currents. The delay times for the at least two involved gradient coils are normally different. A more detailed discussion is found in the journal article "On spatially selective RF excitation and its analogy with spiral MR image acquisition" by Peter Börnert and Bernd Aldefeld, MAGMA 7 (1998), P. 166-178.

Given a one-dimensional selective RF pulse, the selection gradient is normally constant. A deviation between the $B_1$ pulse shape and the actual applied gradient field due to the delay times consequently only occurs here at the beginning or at the end of the radiation. Since the deposited RF energy is normally low anyway at these time intervals, the gradient delay times here behave "docile"—they thus have only a slight effect on the selection profile.

SUMMARY OF THE INVENTION

An object of the present invention is to provide a method to determine a magnetic resonance control sequence of the aforementioned type and a corresponding control sequence determination device, with which the aforementioned problems due to the gradient delay times in the two-dimensional selective excitation of a rotationally-symmetrical excitation profile can be avoided, or at least reduced.

In the method according to the invention a magnetic resonance control sequence is determined, as described above, with a pulse arrangement that acts selectively in at least two spatial directions (that preferably are situated orthogonal to one another) in order to excite a limited, rotationally symmetrical excitation profile (an "excitation volume") within the examination subject. This pulse arrangement has a two-dimensional selective RF excitation pulse that includes a series of multiple, separate (i.e. spaced apart from one another in time) partial RF pulses. Parallel to the series of partial RF pulses, in order to achieve the desired selection effect, the pulse arrangement includes gradient pulses that are placed in coordination in the two spatial directions so that the RF energy introduction (i.e. the delivery of RF energy) of different partial RF pules respectively takes place on circular k-space transmission trajectories that are concentric to one another, as considered in transmission k-space. This means that a separate, circular transmission trajectory (also called a "ring trajectory" in the following) is respectively associated with the individual partial RF pulses, and these ring trajectories lie concentrically with one another in a plane that is spanned by the k-space directions associated with the spatial directions of the gradients. The amplitude of the envelope (also designated as a $b_1$ amplitude in the following) of the (amplitude-modulated) partial RF pulses is thereby respectively constant during the duration of a pass of the associated ring trajectory (i.e. during the duration T of the RF radiation of a partial RF pulse).

In order to achieve this trajectory shape, a first partial gradient pulse (thus a first gradient field) whose amplitude oscillates sinusoidally with a period T during the time interval T and whose direction is orthogonal to the axis of symmetry of the excitation volume, and at the same time a second partial gradient pulse (or a second gradient field) whose amplitude oscillates cosinusoidally with the period T during this and whose direction is orthogonal to the axis of symmetry and orthogonal to the direction of the first gradient field, are superimposed on the static, at least approximately homogeneous $B_0$ field, during a time interval T, namely the revolution time on the respective orbit of the transmission trajectory, and thus the transmission time of a partial RF pulse.

Fundamentally, such a partial RF pulses is constructed similar to the spatially selective inversion or, respectively, refocusing pulse ("$\pi$ pulse") described in U.S. Pat. No. 4,812,760, which also has a rectangular envelope and sinusoidal gradient curves along a first gradient direction as well as a cosinusoidal gradient curve along a second gradient direction. However, a sufficient spatial localization is not achieved with such a "$\pi$ pulse". The desired, cylindrically symmetrical excitation profile can be selectively excited only by the formulation according to the invention of a spatially selective RF pulse composed of multiple (i.e. at least two, but particularly preferably even more) partial RF pulses on ring trajectories that are concentric with one another.

Because according to the present invention, multiple concentric ring trajectories are chosen for the selective excitation instead of an EPI trajectory or spiral trajectory, and (as will be explained later) the $B_1$ amplitude can be constant during the pass of a respective ring trajectory, in spite of the existence of gradient delay times an extraordinary robustness of the selection profile is achieved, similar to the case for one-dimensional selective RF pulses (with constant gradient amplitude given temporally varying $B_1$ amplitude).

The pulse arrangement can have a number of additional RF pulses and gradient pulses, and these can also be selectively exciting pulses. It is thus not necessary that all partial pulses lie on the concentric ring trajectories. For example, the spatially selectively acting pulse series can additionally have RF pulses that lie on a spiral trajectory. It is possible that, for example, the outer region of k-space is filled using a (faster) spiral trajectory, and the inner region of k-space is filled using the (more precise) concentric ring trajectories according to the invention.

A control sequence determination device according to the invention for determination of such a magnetic resonance control sequence requires at least one input interface arrangement to receive excitation profile data which define the spatial extent of a limited, rotationally symmetrical excitation profile to be excited within an examination subject. For example, this excitation profile data can be position data of the rotationally symmetrical excitation profile, for example the position or, respectively, attitude of the rotation axis, as well as a diameter of the volume to be excited. For example, the input interface arrangement can be a user interface, such as to allow manually entry of such position data, and in particular is a graphical user interface in order to indicate (or mark in another manner) the desired excitation profile in the shown image data of the examination subject. Alternatively or additionally, the input interface arrangement can have a device in order to automatically generate suitable excitation profile data for an examination subject (for example for a navigator application) or to retrieve such profile data from a corresponding device or a memory.

Moreover, according to the invention the control sequence determination device requires a pulse arrangement determination unit to determine at least one pulse arrangement that acts selectively in at least two spatial directions in order to excite the excitation profile (predetermined with the aid of the input interface arrangement) in a precisely defined and limited manner). This pulse arrangement determination unit is designed so that it determines an RF excitation pulse of the pulse arrangement so that it includes a sequence of multiple partial RF pulses and—in parallel with the sequence of partial RF pulses—coordinated gradient pulses are placed in the two spatial directions so that the RF energy introduction of different partial RF pulses in transmission k-space respectively takes place on circular k-space transmission trajectories (ring trajectories) that are concentric with one another, and the amplitude of the envelope of the partial RF pulses is thereby constant during the duration of a pass of a ring trajectory.

Moreover, the control sequence determination device should have a suitable control sequence output interface in order to pass the sequence to other control units of the magnetic resonance tomography system. For example, the control sequence output interface can be an interface that transmits the sequence to a magnetic resonance controller in order to therefore directly control the measurement, but also to an interface that sends the data via a network and/or stores it in a memory for later use.

In addition to a radio-frequency transmission device to emit the RF pulses, a magnetic resonance system according to the invention has a gradient system to switch the necessary gradients and a control device that is designed in order to emit the radio-frequency pulse train (i.e. the RF pulses) to implement a desired measurement on the basis of a predetermined magnetic resonance control sequence, and in coordination with this to emit a gradient pulse train (i.e. the associated gradient pulses) via the gradient system. Moreover, the magnetic resonance system has a control sequence determination device described above in order to determine a control sequence in the manner according to the invention, and to pass these to the control device.

In a method according to the invention for operation of a magnetic resonance system according to the method described in the preceding, a control sequence is accordingly determined and then the magnetic resonance system is operated using the control sequence.

As is explained later using test measurements, the control methods according to the invention can additionally be used advantageously within a method for adjustment and/or calibration of a magnetic resonance system with regard to gradient delay times. For example, for this purpose the magnetic resonance system can be controlled (i.e. operated) repeatedly with the method according to the invention under artificial variation of the gradient delay times, i.e. in each individual measurement (data acquisition) with different adjusted gradient delay times. Magnetic resonance image data (for example simple slice images of a defined excitation profile) are thereby generated that originate from (represent) a very specific point in the examination subject or in a phantom or the like provided for adjustment and/or calibration measurement. The same excitation profile is preferably always selectively excited again in these repeated measurements. The desired adjustment or, respectively, calibration of the magnetic resonance system with regard to the gradient delay times can then take place on the basis of an analysis of these magnetic resonance image data. This analysis can be performed visually by an operator, for example, by operator varying the gradient delay times again between different acquisitions and then visually checking in the image data whether the excitation profile is located at the desired point. These adjustment and/or calibration measurements are repeated with variation of the gradient delay times until the measured excitation profile is located precisely at the desired location, and thus the system-intrinsic (initially unknown) delay time is compensated exactly. The delay times that are thereby determined can also be protocoled and be taken into account in further measurements, for example.

Significant parts of the control sequence determination device can be fashioned in the form of software components. This applies in particular to the pulse arrangement determination unit. The cited interfaces can likewise be fashioned at least in part in the form of software and possibly access hardware interfaces of an existing computer. The invention thus also encompasses a non-transitory, computer readable storage medium that can be loaded directly into a memory of a control sequence determination device, encoded with program code segments (programming instructions) in order to execute all steps of the method according to the invention when run in the control sequence determination device. Such a realization in software has the advantage that previous devices that are used to determine control sequences can be suitably modified via implementation of the program in order to determine optimized control sequences in the manner according to the invention.

There are various possibilities for the precise embodiment of the partial RF pulses on the individual ring trajectories. One possible parameter is hereby the duration that is required in order to traverse a ring trajectory.

In a first variant, it is ensured that the duration of the traversal of the circular ring trajectories is the same length for at least two of the different partial RF pulses (in the extreme case for all partial RF pulses) of the RF excitation pulse that act along a circular ring trajectory. This is hereby the simplest possibility. The procedure is analogous to a constant angular velocity given a two-dimensional spiral pulse (i.e. given emission of an RF pulse along a spiral-shaped trajectory in k-space).

In an alternative variant, the partial RF pulses and the associated gradient pulses are designed so that the duration of the traversal of the circular k-space trajectory is respectively determined individually for at least two different partial RF pulses, which means that the different partial RF pulses can in particular be of different length. By individualization of the run times, an optimization of the sequence is possible insofar as that the total duration of the RF excitation pulse can be minimized, and nevertheless boundary conditions, for example a maximum allowable slew rate of the gradient pulses and/or a maximum allowable gradient amplitude, can be safely complied with.

In order to achieve this, the duration of the traversal of the circular k-space trajectory of each of the partial RF pulses can preferably be chosen so short that the gradient pulses do not exceed the predetermined maximum slew rate (directly). This is approximately analogous to a spiral-shaped excitation with constant gradient slew rate.

Independently of whether the pulse durations of the different partial RF pulses are of identical length or are set individually, the respective amplitude of the envelopes (i.e. the $b_1$ amplitude) of the partial RF pulses—which amplitude is kept constant during the duration of a traversal of a circular transmission trajectory—is established individually, meaning that the partial RF pulses can in particular have different $b_1$ amplitudes.

In order to achieve a particularly fast RF excitation pulse—i.e. to keep the total time of the traversal of all concentric ring trajectories as short as possible—the gradient pulses are preferably designed so that two temporally adjacent partial RF pulses of adjacent, concentric, circular k-space transmission trajectories are traversed in opposite directions in transmission k-space. This means that it is ensured that, for example, a first ring trajectory is traversed in the clockwise direction, the directly adjacent ring trajectory is then traversed counter-clockwise, and the next ring trajectory after that is again traversed clockwise. As will be explained later, in this variant a particularly larger amount of time can be saved by combining pre-phasing gradients and rephasing gradients before and after the individual partial RF pulses.

An additional parameter that is relevant in the precise design of an RF excitation pulse with concentric ring trajectories is the spacing of the ring trajectories from one another.

In a first variant, the gradient pulses are designed so that the circular k-space transmission trajectories form equidistant rings in transmission k-space around a common center. In this variant, the radial spacings between two ring trajectories are thus always the same. A particularly uniform depositing of energy into k-space is achieved with this.

In an alternative variant, the gradient pulses are designed so that the concentric circular k-space transmission trajectories form rings whose radial spacing relative to one another is different. In a particularly preferred variant, the concentric circular k-space transmission trajectories form rings whose radial spacing relative to one another becomes smaller in the direction towards the common center. By causing a denser ring trajectory spacing toward the k-space center, it can be ensured that sufficient energy is deposited, in particular in the important frequency ranges with the primary information about the excitation profile. The time required for this can then be saved in the less important edge regions of k-space, wherein the spacing of the ring trajectories relative to one another is smaller.

A further adjustable parameter is the number of ring trajectories of an RF excitation pulse. It is advantageous to place the ring trajectories relatively densely in order to achieve an excitation in space with sufficient density. However, the total time for the RF excitation pulse inevitably also increases with an increasing number of ring trajectories.

For this it is particularly advantageous for the number of concentric circular k-space transmission trajectories to be chosen depending on a ratio of the spacing of the first lateral excitation to a diameter of the excitation profile. Since an excitation in the region of the first lateral excitation is no longer desired, and thus the spacing of the lateral excitation from the axis of symmetry of the excitation profile and the diameter of the (cylindrically symmetrical) excitation profile are the decisive parameters for the excitation, it has turned out that it is sufficient to choose the number of ring trajectories corresponding to twice the value of this spacing of the first lateral excitation, divided by the diameter of the excitation profile. It is thereby ensured that the spacing of the ring trajectories relative to one another corresponds to at least the minimum spacing given a sampling according to the Nyquist theorem.

An additional parameter is the target flip angle (target excitation angle) or, respectively, the target flip angle distribution that is to be achieved given excitation within the excitation profile.

In a first variant, the amplitude of the envelope of the partial RF pulses is determined such that the target flip angle within the cylindrical excitation profile depends on a radial spacing r from the cylinder axis of the cylindrical excitation profile. This means that the target flip angle decreases from the inside out. The dependency on the radial spacing is preferably Gaussian.

In an alternative version, the amplitude of the envelope of the partial RF pulses is determined such that a target flip angle within a cylindrical excitation profile is essentially constant, i.e. within the possible tolerances. In this variant, the target flip angle distribution is thus optimally homogeneous across the excitation profile.

Moreover, however, other distributions are also possible, for example a nearly constant or homogeneous excitation in an inner region and then an (in particular Gaussian) decline outside of this homogeneous region.

It is also noted again that the aforementioned different variants for the individual parameters (such as run times within the ring trajectories, spacing of the ring trajectories, $B_1$ amplitudes or flip angle distributions) can be arbitrarily combined.

DESCRIPTION OF THE PREFERRED EMBODIMENTS

Figure 1:
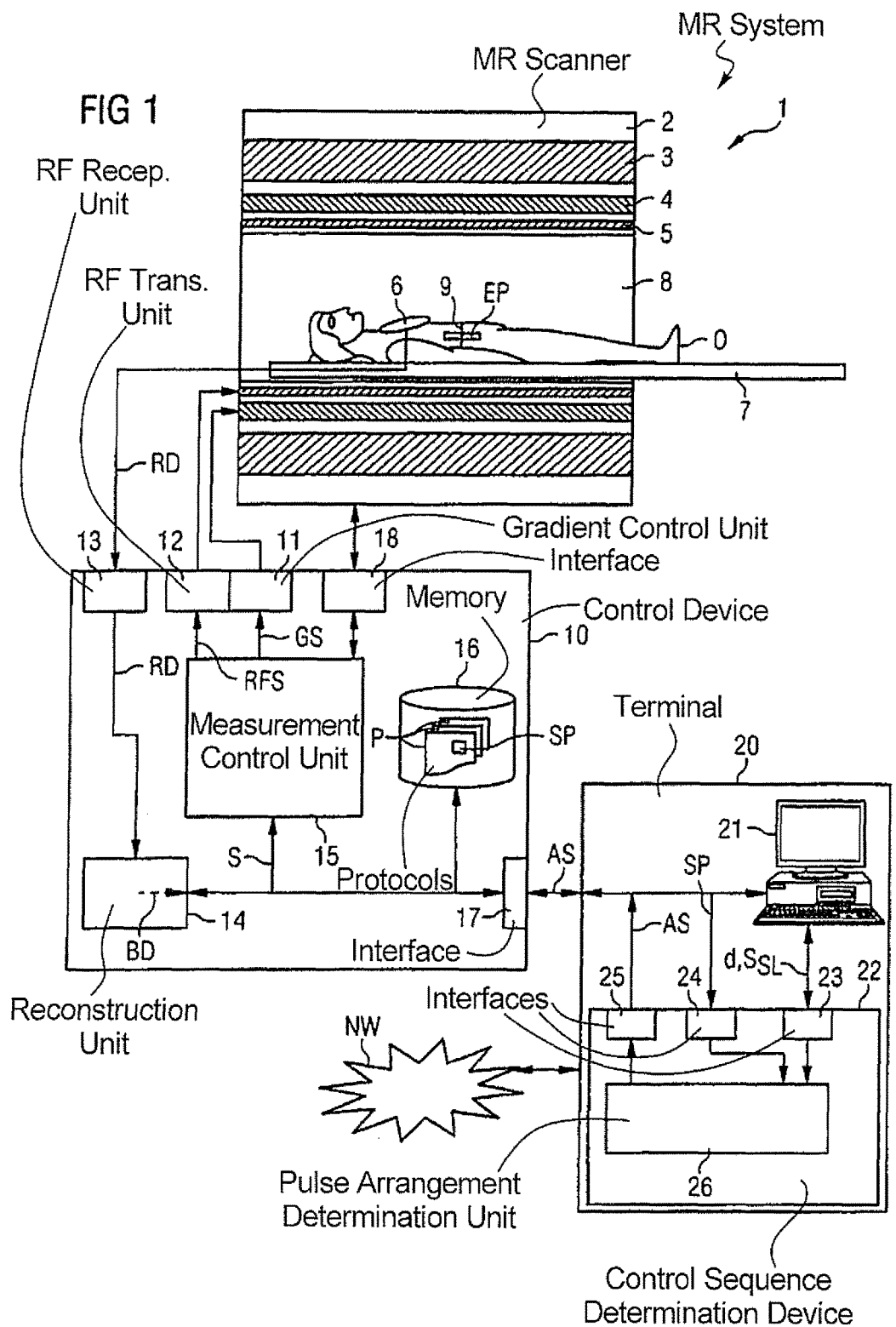
FIG. 1 is a schematic depiction of an exemplary embodiment of a magnetic resonance system according to the invention.

A magnetic resonance (MR) system 1 according to the invention is schematically depicted in FIG. 1. The system includes the actual magnetic resonance scanner 2 with an examination space 8 or patient tunnel located therein. A bed 7 can be driven into this patient tunnel 8, such that a patient O or test subject lying on the bed 7 can be supported at a defined position within the magnetic resonance scanner 2 (relative to the magnet system and radio-frequency system arranged therein) during an examination. The patient O or test subject on the bed 7 also can be moved between different positions during a measurement (data acquisition).

Among the components of the magnetic resonance scanner 2 are a basic field magnet 3, a gradient system 4 with magnetic field gradient coils to generate magnetic field gradients in the x-, y- and z-direction, and a whole-body radio-frequency (RF) coil 5. The magnetic field gradient coils in the x-, y- and z-direction are controllable independently of one another so that—by a predetermined combination—gradients can be applied in arbitrary spatial directions (for example in a slice selection direction, in a phase coding direction, or in a readout direction) that are not necessarily situated parallel to the axes of the spatial coordinate system. The acquisition of magnetic resonance signals produced in the examination subject O takes place using the whole-body coil 5 with which the radio-frequency signals for creation of the magnetic resonance signals are also normally emitted. However, these signals are typically received with a local coil arrangement 6 with local coils (of which only one is shown) placed on or below the patient O, for example. All of these components are known in principle to those skilled in the art, and therefore are only roughly schematically depicted in FIG. 1.

The components of the magnetic resonance scanner 2 are controllable from a control device 10. This can thereby be a control computer that can also include a number of individual computers (which possibly are spatially separated and connected among one another via suitable cables or the like). This control device 10 is connected via a terminal interface 17 with a terminal 20 through which an operator can control the entire system 1. In the present case, this terminal 20 has a computer 21 with keyboard, one or more monitors and additional input devices (for example mouse or the like). The computer 21 may be designated such that a graphical user interface is provided to the operator.

Among other things, the control device 10 has a gradient control unit 11 that can include multiple sub-components. The individual gradient coils can be fed with control signals according to a gradient pulse sequence GS via this gradient control unit 11. As described above, these are gradient pulses that are set at precisely provided temporal positions and with a precisely predetermined time curve during a measurement.

Moreover, the control device 10 has a radio-frequency transmission unit 12 in order to feed respective radio-frequency pulses into the whole-body radio-frequency coil 5 according to a predetermined radio-frequency pulse sequence RFS of the control sequence AS. The radio-frequency pulse sequence RFS includes the aforementioned selective excitation pulses. The receipt of the magnetic resonance signals then occurs with the aid of the local coil arrangement 6, and the raw data RD acquired by this are read out and processed by an RF reception unit 13. The magnetic resonance signals in digital form are passed as raw data RD to a reconstruction unit 14, which reconstructs the image data BD from these and stores them in a memory 16 and/or passes them via the interface 17 to the terminal 20 so that the operator can view them. The image data BD can also be stored and/or displayed and evaluated at other locations via a network NW. Alternatively, a radio-frequency pulse sequence can be emitted via the local coil arrangement and/or the magnetic resonance signals can be received by the whole-body radio-frequency coil (not shown).

Through an additional interface 18, control commands are transmitted to other components of the magnetic resonance scanner 2 (for example the bed 7 or the basic field magnet 3) or measurement values and other information are received.

The gradient control unit 11, the RF transmission unit 12 and the RF reception unit 13 are controlled in coordination by a measurement control unit 15. Through appropriate commands, this ensures that the desired gradient pulse sequence GS and radio-frequency pulse sequence RFS of the pulse sequence are emitted. Moreover, it must be ensured that the magnetic resonance signals at the local coils of the local coil arrangement 6 are read out by the RF reception unit 13 at the matching point in time and are processed further, meaning that readout windows must be set in that the ADCs of the RF reception unit 13 are switched to receive, for example. The measurement control unit 15 likewise controls the interface 18.

The basic workflow of such a magnetic resonance measurement and the cited components for control are known to those skilled in the art, and thus need not be discussed in further detail herein. Moreover, such a magnetic resonance scanner 2 and the associated control device can have additional components, which here are likewise not explained in detail herein. The magnetic resonance scanner 2 can also be designed differently, for example with a laterally open patient space, or as a smaller scanner in which only one body part can be positioned.

In order to start a measurement, via the terminal 20 an operator typically selects a control protocol P provided for this measurement from a memory 16, in which control protocols P for respectively different measurements are stored. This control protocol P includes, among other things, various control parameter values SP for the respective measurement. Among these control parameter values SP are, for example, the sequence type, the target magnetizations for the individual radio-frequency pulses, echo times, repetition times, the various selection directions etc. Slice thicknesses, resolution, number of slices and, in the case of a 3D excitation, the slab thickness or additional dimensions of an arbitrary excitation profile (i.e. excitation profile data), can likewise be provided in the protocol P. Furthermore, the control parameter values SP can include information as to whether the respective measurement is a measurement with navigator and, if so, the excitation profile data for the excitation profile EP, which is necessary for this navigator application. For the application schematically depicted in FIG. 1, this excitation profile EP can be the aforementioned "pencil beam" that extends cylindrically symmetrically in the z-direction in the body of the patient O, and proceeds through the diaphragm 9 of the patient O.

All of these control parameter values SP are provided via (among other things) an input interface 24 of a control sequence determination device 22 so that this determines a matching control sequence AS. The control parameter values SP can initially be offered to the operator for adoption upon retrieval of this protocol, and the operator can arbitrarily vary the values with the use of the user interface and adapt them to the current examination task. In particular, the operator can establish the excitation profile data (for example a diameter d, the precise position of the axis of symmetry, etc. of the rotationally symmetrical excitation profile EP) via the computer 21 of the terminal 20 with the associated graphical user interface, or can modify excitation profile data that are already defined in the protocol P via the control parameter values SP. This is indicated by the interface arrangement 23 in FIG. 1.

Moreover, the user can also retrieve control protocols via a network NW (instead of from the memory 16), for example from a manufacturer of the magnetic resonance system, with corresponding control parameter values SP, and then use these as described in the following.

Based on the control parameter values SP (including the excitation profile data), a control sequence AS is then determined according to which the control of the remaining components via the measurement control unit 15 ultimately takes place. This control sequence then includes (among other things) the pulse arrangement in order to selectively excite the chosen excitation profile EP. As mentioned, the control sequence AS is calculated in a control sequence determination device 22 that is depicted as part of the terminal 20, and is passed to the control device 10 of the magnetic resonance scanner 2 via a control sequence output interface 25. Among other things (the additional components are not depicted in FIG. 1 for the sake of better clarity), the control sequence determination device 22 comprises a pulse arrangement determination unit 26 which determines the aforesaid pulse arrangement for selective excitation of the excitation profile EP. For example, the entire control sequence determination device 22 and its components can be realized in the form of software on one or more suitable processors. The precise functionality of the control sequence determination device 22 and its individual components is explained further in the following, wherein the pencil beam excitation explained above is merely assumed as an example without, however, limiting the invention to this example.

To design a two-dimensional RF pulse in order to excite an x/y plane situated orthogonal to the axis of symmetry s in positional space of a cylindrically symmetrical excitation profile EP, in addition to the excitation profile in this plane a two-dimensional k-space transmission trajectory must in general initially be chosen within the associated x/y plane in k-space (with the time-dependent coordinates $(k_x(t), k_y(t))$ in k-space, also abbreviated in the following as $(k_x, k_y)$). The excitation profile is determined by the function $P(x,y)$ at the location with the coordinate values x and y. The function $P(x,y)$ indicates the desired magnitude of the transversal magnetization relative to the magnitude of the steady state magnetization, thus has no unit. The k-space coverage (extent) of this trajectory determines the spatial resolution with which the desired selection profile can be realized. The sampling density of the trajectory in k-space determines the spacing of the first lateral band of the excitation in positional space, also called FOV (field of view). Such lateral bands are unavoidable due to the discrete sampling.

With the selected k-space trajectory $(k_x, k_y)$, the two-dimensional gradient field $(g_x(t), g_y(t))$ during the radio-frequency radiation is linked via $$(k_x(t), k_y(t)) = -\frac{\gamma}{2\pi} \int_t^T (g_x(\tau), g_y(\tau)) d\tau \quad (1)$$

and $$(g_x(t), g_y(t)) = \frac{2\pi}{\lambda}\left(\frac{dk_x(t)}{dt}, \frac{dk_y(t)}{dt}\right) \quad (2)$$

The minus sign in Formula (1) is a consequence of the convention of starting the integration at the end of the RF pulse (t=T). The time t thus indicates the remaining time until the end of the RF pulse.

The associated pulse shape $b_1(t)$ of the RF pulses $b_1(t)$ is the time-dependent amplitude that results from the weighted two-dimensional Fourier transformation of the desired spatial excitation profile $P(x,y)$ by the desired excitation profile $P(x,y)$:

$$b_1(t) \propto \frac{|(g_x(t), g_y(t))|}{\rho(k_x(t), k_y(t))} \int_{-\infty}^{\infty}\int_{-\infty}^{\infty} P(x,y) e^{2\pi i(k_x x + k_y y)} dx\, dy \quad (3)$$

This formula can be derived from the Bloch equation (in the limit of the small angle excitation); see for example J. Pauly et al. "A k-Space Analysis of Small-Tip-Angle Excitation" in Journal of Magn. Res. 81, Pages 43 to 56, 1989, and C. J. Hardy et al. "Correcting for Nonuniform k-Space Sampling in Two-Dimensional NMR Selective Excitation" in Journal of Magn. Res. 87, Pages 639 to 645, 1990.

In Formula (3), the first weighting factor $$|(g_x(t), g_y(t))| = \sqrt{g_x^2(t) + g_y^2(t)} \quad (4)$$

is the transverse velocity in k-space.

The second factor weights the density of k-space sampling at the position $(k_x, k_y)$ in k-space:

$$\rho(k_x, k_y) = \frac{\Delta l(k_x, k_y)}{\Delta A(k_x, k_y)} \quad (5)$$

In Formula (5), $\Delta A(k_x, k_y)$ is a small area of k-space in the environment of the k-space point $(k_x, k_y)$, and $\Delta l(k_x, k_y)$ is the length of the trajectory that is enclosed by the area. The factors according to Formulas (4) and (5) clearly indicate that the RF amplitude is to be reduced where k-space is scanned slowly or, respectively, with high density, and vice versa.

In the method according to the invention, a k-space trajectory with at least two concentric ring trajectories should be chosen for selective excitation of the excitation profile. Such a k-space trajectory, with eight concentric ring trajectories $TR_1, TR_2, \ldots, TR_8$ in total that respectively proceed at an equidistant radial distance $\Delta kr$ relative to one another, point-symmetrically around the center point of k-space $S_k$, is shown as an example in FIG. 2.

Figure 2:
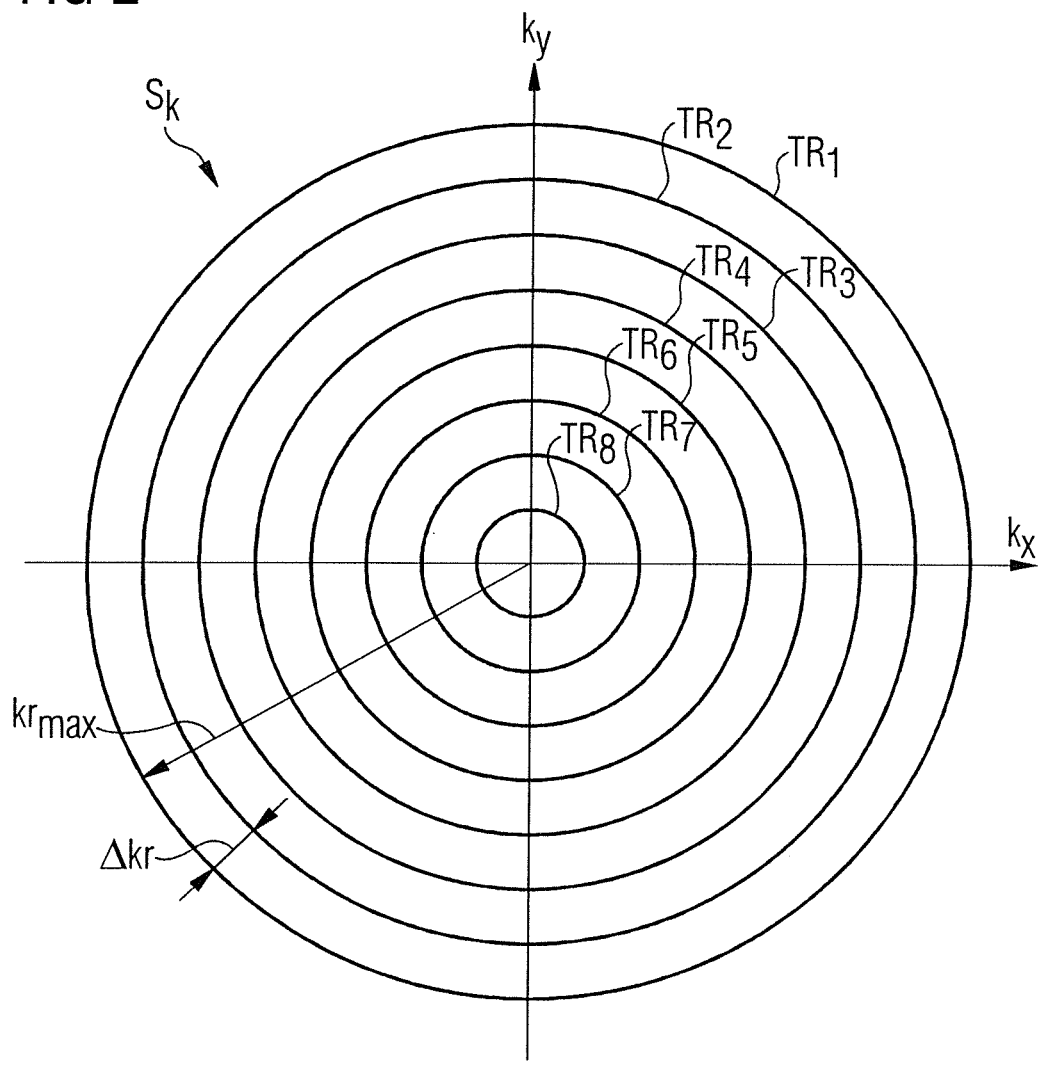
FIG. 2 is a schematic depiction of equidistant, concentric ring trajectories in an x/y plane in k-space according to a first exemplary embodiment of the invention.

A concentric ring trajectory is achievable in that the two selection gradients (i.e. the gradient pulses emitted during the selective RF pulse and serving for selection) are modulated by a sine or, respectively, cosine function during the RF radiation:

$$g_{x,n}(t) = A_n \sin\left(2\pi \frac{t}{T_n}\right) \quad (6)$$
$$g_{y,n}(t) = A_n \cos\left(2\pi \frac{t}{T_n}\right)$$

wherein n is the excitation index (i.e., the index of the ring trajectory) that assumes a value between 1 and N, wherein N is the number of rings of the chosen trajectory (in the example according to FIG. 2, N=8 thus applies). $A_n$ is the magnitude of the gradient amplitude during the n-th excitation, and $T_n$ is the duration of the n-th excitation (i.e. the RF radiation at the n-th ring). One possible common phase factor is omitted in Formulas (6)—without limiting the generality—in order to keep the formulas as simple as possible.

The first weighting factor in Formula (3)—the k-space transverse velocity—is therefore constant during the traversal of a ring trajectory:

$$|(g_{x,n}(t), g_{y,n}(t))| = \sqrt{g_{x,n}^2(t) + g_{y,n}^2(t)} = A_n \quad (4')$$

The second weighting factor—the density compensation factor—

$$\rho_n(k_x, k_y) = \frac{\Delta l_n(k_x, k_y)}{\Delta A_n(k_x, k_y)} \quad (5')$$

can be estimated for equidistant ring trajectories via the reciprocal value of the radial spacing $\Delta kr$ between adjacent rings in k-space. This is explained in detail below with the use of FIG. 5. The density compensation factor is only significant in the case of a variable density allocation of k-space with ring trajectories, namely non-equidistant spacing of the ring trajectories. For specific ring trajectories, n (with 1<n<N) can then be used as a density compensation factor (for example 1) due to the average radial spacing from the two nearest neighbor rings.

According to the invention, the desired excitation profile $P(x,y)$ is rotationally symmetrical and thus depends (insofar as it is specified in polar coordinates) only on the radial spacing $r = \sqrt{x^2 + y^2}$, and not on the polar or azimuthal angle $\varphi_r$, meaning that $P(x,y) = P(r)$ applies.

Via a coordinate transformation of the Fourier transformation in Formula (3) of Cartesian to polar coordinates, $$\int_{-\infty}^{\infty}\int_{-\infty}^{\infty} P(x, y) e^{2\pi\, i(k_x(t)x + k_y(t)y)} dx dy = \quad (3')$$

$$\int_{r=0}^{\infty} \int_{\varphi_r=-\pi}^{\pi} P(r) e^{2\pi\, i\, kr\, \cos(\varphi_r - \varphi_k)} r\, dr\, d\varphi_r =$$

$$\int_{r=0}^{\infty} \int_{\varphi_r=-\pi}^{\pi} P(r) \left( \sum_{m=-\infty}^{\infty} i^m J_m(kr) e^{im(\varphi_r - \varphi_k)} \right) r\, dr\, d\varphi_r$$

$\varphi_r$ is the azimuthal angle of the spatial vector $(x,y)=(r, \varphi_r)$, and $\varphi_k$ is the azimuthal angle of the wave vector $(k_x, k_y)=(k, \varphi_k)$, and $J_m$ is the m-th order Bessel function. Under the assumption that the desired excitation profile is rotationally symmetrical, the integration over the spatial azimuthal angle can be incorporated into the sum, and only the 0th-order term remains. Formula (3') can therefore be simplified as:

$$b_1(t) \propto 2\pi \frac{|(g_x(t), g_y(t))|}{\rho(k_x(t), k_y(t))} \int_0^{\infty} P(r) J_0(k(t)r) r\, dr \quad (7)$$

Since the magnitude of the wave vector $k(t)=k$ is constant on an orbit, it directly follows from this depiction that the integral on the right side is also constant for a defined orbit (excitation), and therefore the $b_1$ amplitude during a single ring trajectory as well. As explained above, switching delays of the gradient coils thus are no longer of consequence.

A two-dimensional RF pulse according to the invention can be constructed as a "composite" RF pulse with multiple such partial pulses, wherein each partial pulse comprises a "rectangular pulse" with constant amplitude $b_1$ (n) of duration $T_n$, and the gradients oscillate sinusoidally or, respectively, cosinusoidally with period $T_n$ during the radiation duration $T_n$, such that an orbit (namely the associated n-th ring trajectory) in associated excitation k-space is traversed.

In practice, the ring trajectories must initially be established more precisely for excitation of a defined volume or excitation profile before the design of the individual partial pulses. In the following, a cylindrical rod volume with a diameter d (which, for example, can be used in the navigator technique) is assumed again as an example.

The parameters that are relevant to the user (and therefore specified by him) are the diameter d of the rod and the spacing $S_{SL}$ of the first lateral excitation SL (side lobe). Side lobes are unavoidable due to the discrete sample of k-space. The user will choose the spacing $S_{SL}$ of the first side lobe SL to be so large that it specifically lies outside of the examination subject and no tissue is excited with it. If the examination subject is an adult, typical values are d~25 mm for the diameter of the excitation and $S_{SL}$~400 mm for the spacing of the first side lobe given the aforementioned navigator application.

From Formula (7) it is clear that the complex-valued $b_1$ field and the desired excitation profile P(r) form a Fourier transformation pair.

From the property $P(r)=0$ for $r>S_{SL}$ and the Nyquist theorem, the minimum spacing of the sampling in k-space follows according to $$\Delta kr \leq \frac{1}{2 \cdot S_{SL}} \quad (8)$$

The specified diameter d of the excitation over the diameter $2 \cdot kr_{max} = 2 \cdot N \cdot \Delta kr$ of scanned k-space determines the number N of ring trajectories:

$$\frac{d}{2} = \frac{1}{2 \cdot kr_{max}} \rightarrow d = \frac{1}{N \cdot \Delta kr} \quad (9)$$

Since the Fourier transformation of the desired excitation profile for $kr > kr_{max}$ is zero, its frequency spectrum is limited. The Nyquist theorem is therefore applicable, and the relation (9) is a direct consequence of this.

The minimum number N of ring trajectories is obtained from Formulas (8) and (9) as a function of the specified parameters d (diameter of the excitation profile) and $S_{SL}$ (spacing of the first side lobe):

$$N = 2 \cdot \frac{S_{SL}}{d} \quad (10)$$

Figure 3:
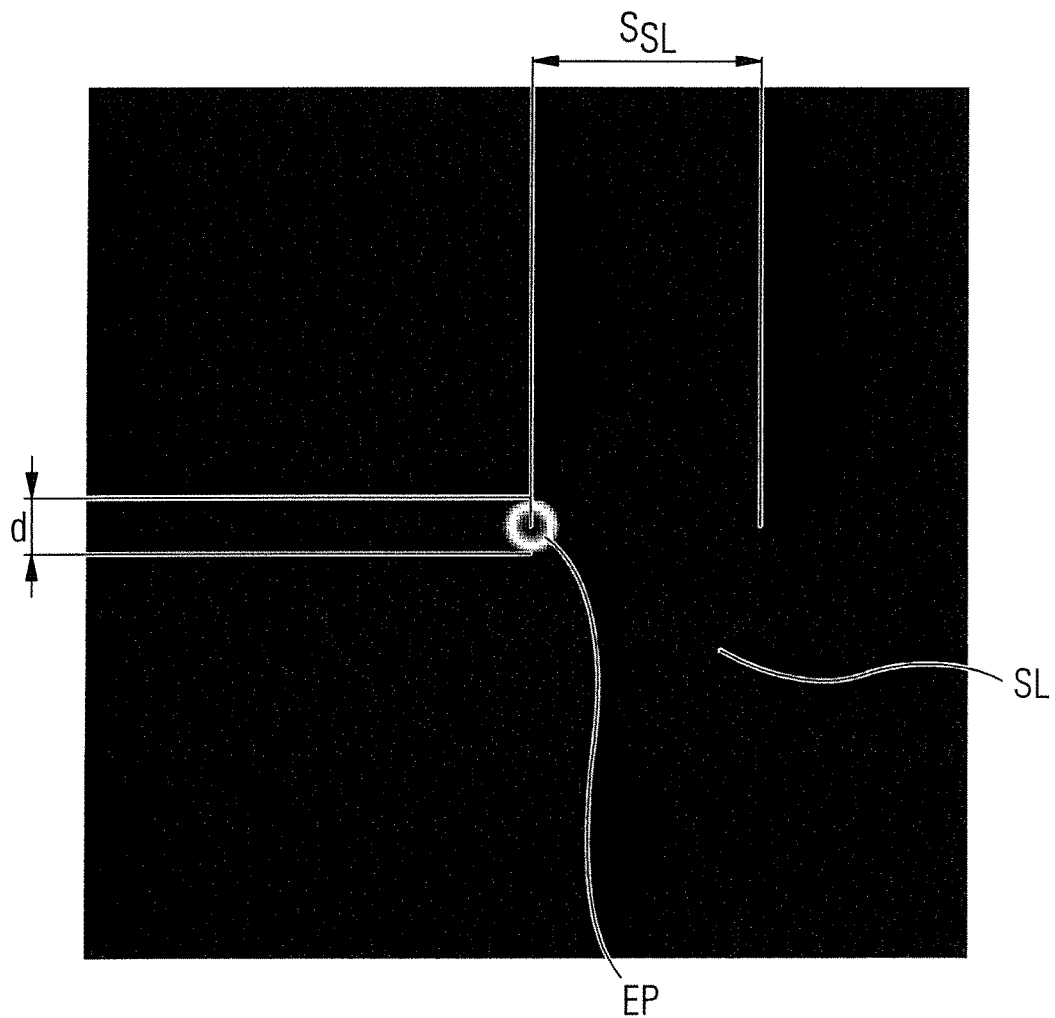
FIG. 3 shows a magnetic resonance slice image of a cylindrically symmetrical excitation profile and the 1st lateral excitation within a phantom in positional space.

As an example, for explanation, FIG. 3 shows a positional space image of a slice (thus a cross section) through a rod-shaped excitation profile EP with diameter d and with a side lobe SL at a distance $S_{SL}$. The positional space image is an image of a spherical phantom with a diameter of 240 mm. In a FLASH sequence, the conventional excitation profile was replaced by a two-dimensional selective RF pulse with an excitation trajectory according to the invention, with concentric ring trajectories. The number of rings was set at N=8, and the spacing of the first lateral ring was set equal to 64 mm. This corresponds to the trajectory shown in FIG. 2, meaning that FIGS. 2 and 3 also illustrate the correlation of the excitation in the two Fourier domains (excitation profile in positional space in FIG. 3 and associated excitation k-space $S_k$ in FIG. 2). According to Formula (10), a diameter of the central excitation profile of d=2·64/8 mm=16 mm would be expected with this. The dimensions determined in the measurement according to FIG. 3 agree well with this calculation. The second lateral band would have a radius of 128 and a diameter of 256 mm, and therefore is already located outside of the sphere. In the acquisition, a quadratic matrix was used with 256 pixels in the readout direction and phase coding direction respectively. The remaining sequence parameters in the creation of the image in FIG. 3 were TR=50 ms, TE=6.3 ms and flip angle 30°, resonance frequency=123 MHz.

If the number N of ring trajectories and the radii $kr_n = n \cdot \Delta kr$ of the ring trajectories n=1 to N are established on the basis of the diameter d of the excitation profile and the side lobe spacing $S_{SL}$, with the use of Formulas (1) and (2) the maximum gradient amplitude $A_n$ and the pulse duration $T_n$ are established for each of the ring trajectories. By integration of Formula (6) over a quarter period, the following relation is obtained between the radius $kr_n = n \cdot \Delta kr$ and the magnitude of the gradient amplitude $A_n$ as well as the duration $T_n$ of the n-th ring trajectory:

$$A_n = \frac{2\pi}{(\gamma/2\pi)} \frac{n \cdot \Delta kr}{T_n} \quad (11)$$

In order to minimize the duration of the excitation pulse, $T_n$ in Formula (11) is chosen so short that (for example) a specified maximum gradient amplitude $G_{max}$ and a specified maximum permissible gradient slew rate $S_{max}$ are specifically not exceeded. While the maximum permissible gradient amplitude $G_{max}$ is normally established by the capability of the gradient system, the capability of the gradient system and possible nerve stimulation of the examined person are advantageously considered in the specification of the maximum permissible gradient slew rate $S_{max}$.

Figure 4:
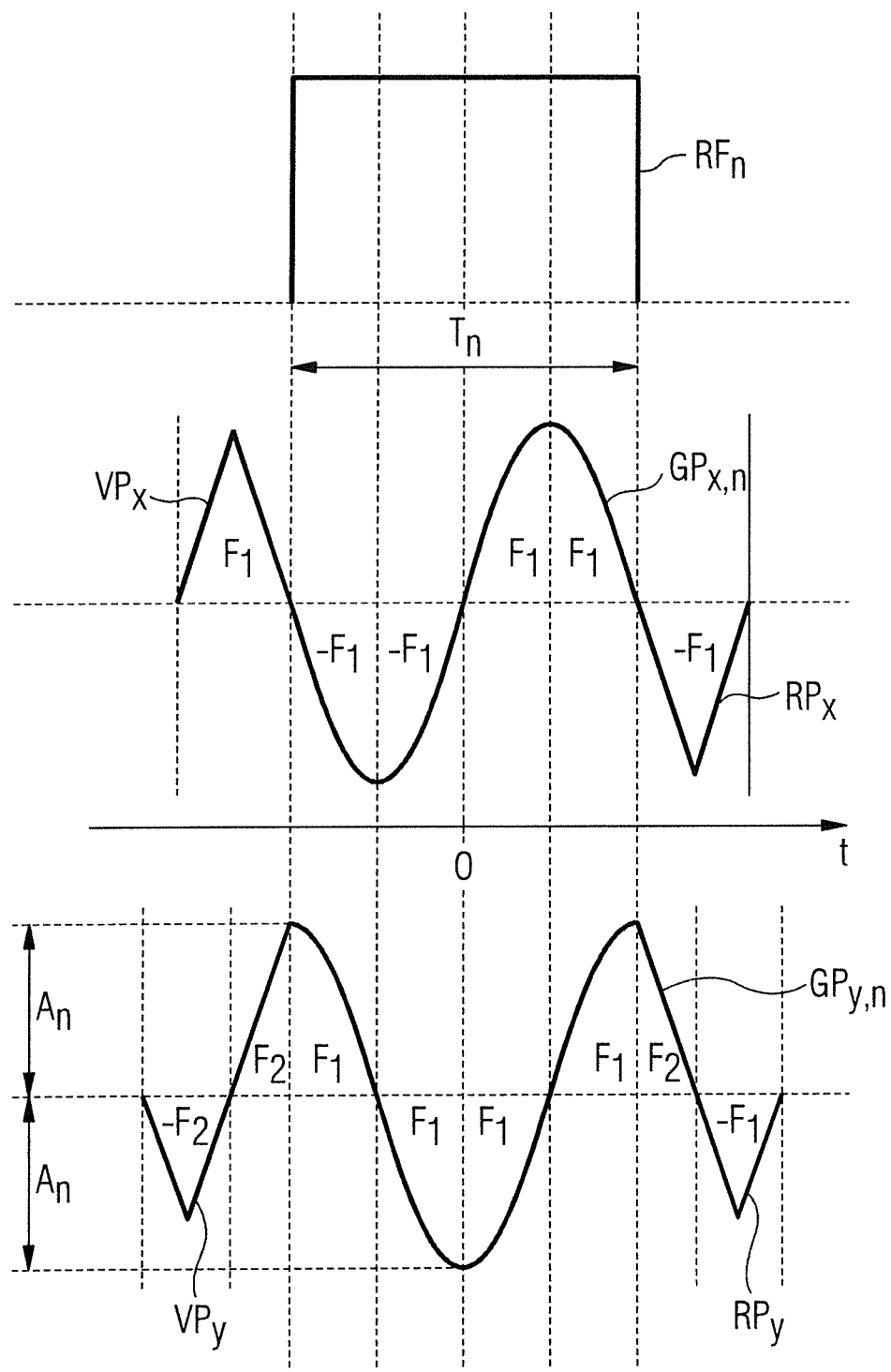
FIG. 4 is a simplified depiction of a pulse diagram for explanation of the design of an individual partial RF pulses.

FIG. 4 shows an example of a design of a partial RF pulse $RF_n$ of a single ring trajectory. The depiction here takes place in the form of a small excerpt from a sequence diagram (pulse diagram). In this pulse diagram, the radio-frequency pulses are shown in a typical manner on an upper time axis, and the gradient pulses to be switched in coordination with said radio-frequency pulses are shown on various time axes lying below this, over time t. Here only the gradient pulses (amplitude $A_n$ of the gradient curves) $GP_{x,n}$, $GP_{y,n}$ in the x-direction and y-direction that are relevant to the selective excitation within the slice are shown. Shown beneath each of the gradients is the respective accumulated 0th moment (the magnitude of the area under the respective gradient pulse) $F_1$, $F_2$—with different polarity depending on the active direction—acting on the spins due to the appertaining gradient curve.

The zero point of the time axis coincides with the middle of the partial RF pulse $RF_n$; corresponding to Formula (6), the x gradient pulse $GP_{x,n}$ has a sinusoidal curve, the y-gradient pulse $GP_{y,n}$ has a cosinusoidal curve, each with a period duration $T_n$ (i.e. the time length of the ring trajectory). This selection can take place arbitrarily without limitation of generality. A respective prephasing pulse $VP_x$, $VP_y$ is shown in both gradient directions before the use of the radio-frequency pulse at the point in time $t=-T_n/2$. After the radio-frequency pulse $RF_n$ is interrupted at the point in time $t=T_n/2$, a respective rephasing pulse $RP_x$, $RP_y$ is switched.

Therefore, the prephasing pulse $VP_y$ in the y-direction is reasonable since the gradient field cannot be ramped up instantaneously from zero to $A_n$ at the point in time $t=-T_n/2$. It thus serves to ramp up the current through the gradient coil. The rephasing gradient $RP_y$ in the y-direction accordingly serves to ramp down the gradient current. The total moment of the two gradient pulses $VP_y$, $RP_y$ is zero ($-F_2 + F_2 = 0$) for each partial RF pulse, i.e. for each ring trajectory. It is thereby achieved that (static) spins that were excited in the transverse plane by an earlier partial pulse such as a prephasing gradient or a rephasing gradient, acquire no phase as a consequence of these gradients. In the special embodiment shown in FIG. 4, a triangular (or trapezoidal) curve was chosen for the prephasing or, respectively, rephasing gradient $VP_y$, $RP_y$ because the duration of the gradient can therefore be minimized for given maximum amplitude $G_{max}$ and slew rate $S_{max}$. However, there is a great deal of freedom here. For example, the gradient noise could be reduced with a three-quarters sine wave. Furthermore, a gradient curve could be chosen from three loops for which the first moment also disappears in order to also leave spins flowing in the y-direction unaffected.

The prephasing pulse $VP_x$ in the x-direction serves to center the k-space trajectory. Its 0th moment $F_1$ is identical to the 0th moment $F_1$ under a quarter period of the sinusoidal gradient pulses $GP_{x,n}$ during the RF excitation. The rephasing gradient $RP_x$ in the x-direction has the same absolute area $F_1$ and opposite polarity. This brings the k-space trajectory back to the origin. The total moment of the gradient in the x-direction (with and without RF radiation) is zero. Therefore, (static) spins that were already excited by an earlier partial pulse remain unaffected. In the embodiment shown in FIG. 4, a triangular curve was selected again to minimize the required time. For example, a trapezoidal curve or a half-sine wave are also alternatively possible here. For example, if the two-dimensional selective RF pulse is used as an excitation pulse in a spoiled gradient echo sequence in which all spins are located before the excitation in the longitudinal direction, the prephasing gradient $VP_x$ can thus be omitted in the x-direction for the first partial pulse of the excitation, for example, since gradients have no influence on spins with longitudinal alignment.

As explained above, the $b_1$ amplitude is constant in each of the individual partial pulses. The calculation of the values $b_{11}, b_{12}, \ldots, b_{1N}$ of the N partial pulses takes place with the use of Formula (7) given a predetermined desired, rotationally symmetrical excitation profile P(r). This Formula (7) specifies only the relative $b_1$ amplitude of each partial pulse or the proportionality, but this is sufficient. The physical value of the $b_1$ amplitude (for example in μT) can therefore be determined as follows.

The magnetization of spins, whose resonance frequency lies within the bandwidth of a (partial) RF pulse, will be flipped out of the steady state by the flip angle $$\alpha = \gamma \int_{t_0}^{t_0+T} b_1(t)dt \quad (13)$$

at the end of the pulse, wherein $t_0$ is the activation time of the partial pulse, and the gyromagnetic ratio γ is a physical constant that depends on the excited nucleus. For protons, their value $\gamma = 2\pi \cdot 42.57$ MHz/T.

Since the $b_1$ amplitude is constant during a partial pulse, for the flip angle contribution of the n-th partial pulse it directly follows from Formula (13) that:

$$\alpha_n = \gamma b'_{1n} T_n \quad (13b)$$

wherein $b_{1n}$ is the value for the n-th partial pulse that is calculated with the aid of Formula (7) (with equals sign instead of the proportionality sign), and $b_{1n}' = c \cdot b_{1n}$ is the initially unknown physical $b_1$ amplitude of the n-th partial pulse. Under the assumption that the total duration of the RF pulse is short relative to the relaxation times (thus the spins do not relax again to a relevant extent during the RF radiation), it is then the case that the flip angle $\alpha$ of the composite pulse is equal to the sum of the flip angle contributions $\alpha_n$ of the n-th partial pulses:

$$\alpha = \sum_{i=1}^{N} \alpha_i = \sum_{i=1}^{N} \gamma b'_{1i} T_i \quad (14)$$

wherein i is hereby only an additional running variable across all partial pulses; N is again the total number of partial pulses.

From Formula (14), the flip angle contribution $\alpha_n$ of the n-th partial pulse is obtained according to:

$$\alpha_n = \frac{\alpha \alpha_n}{\alpha} \stackrel{14}{=} \frac{\alpha \alpha_n}{\sum_{i=1}^{N} \alpha_i} = \quad (15)$$

$$\frac{\alpha \cdot \gamma \cdot b'_{1n} T_n}{\sum_{i=1}^{N} \gamma \cdot b'_{1i} T_i} = \frac{\alpha \cdot \gamma \cdot c \cdot b_{1n} T_n}{\sum_{i=1}^{N} \gamma \cdot c \cdot b_{1i} T_i} = \frac{\alpha \cdot \gamma \cdot c \cdot b_{1n} T_n}{\gamma \cdot c \cdot \sum_{i=1}^{N} b_{1i} T_i} = \frac{\alpha \cdot b_{1n} T_n}{\sum_{i=1}^{N} b_{1i} T_i}$$

The last equals sign applies because the proportionality constant c between $b_{1n}'$ and $b_{1n}$ ($b_{1n}' = c \cdot b_{1n}$) is independent of the partial pulse n. The constant c can thus be pulled into the denominator before summation and be shortened.

The calculation of all terms on the right side of Formula (15) has previously been shown. With the use of Formula (13b), the sought physical value of the $b_1$ amplitude of the n-th partial pulse can then be calculated from the flip angle $\alpha_n$:

$$b'_{1n} = \frac{\alpha_n}{\gamma T_n}. \quad (16)$$

As discussed above, the $b_1$ amplitude of a partial pulse is the one-dimensional Fourier transformation of the desired radial profile, weighted with two factors (namely the k-space transversal velocity and the density compensation factor). The integral in Formula (7) can be calculated analytically or numerically depending on the desired excitation profile. In the realized embodiment, a Gaussian excitation profile $$P(r) = \frac{a^2}{\pi} e^{-a^2 r^2} \quad (17)$$

was chosen, wherein the variable a was established across the desired diameter d such that 90% of the total area lies under the Gaussian function within the diameter d.

The first weighting factor—the k-space transversal velocity—is equal to the magnitude $A_n$ of the gradient amplitude:

$$|(g_{x,n}(t), g_{y,n}(t))| = \sqrt{g_{x,n}^2(t) + g_{y,n}^2(t)} = A_n. \quad (18)$$

The magnitude $A_n$ of the gradient amplitude is constant during the entire ring trajectory and is specified—via Formulas (8) to (11)—as a function of the predetermined parameters d, $S_{SL}$.

The calculation of the second weighting factor—the density compensation factor—is explained in the following as an example of a concentric ring trajectory with equidistant ring spacing.

According to Formula (5), the density compensation factor can be approximated by the quotient from the area $\Delta A(k_x, k_y)$ and the length $\Delta l(k_x, k_y)$ of the trajectory that is enclosed by this area $\Delta A$, which area and length are associated with a k-space sample point $(k_x, k_y)$. The RF amplitude is digitized in every practical realization. $M_n$ is the number of RF sample points ("samples") of the n-th partial pulse. The length $\Delta l_n$ of the n-th trajectory that is associated with each sample point is then the diameter of the n-th ring trajectory, divided by the number of sample points:

$$\Delta l_n = \frac{2\pi \cdot kr_n}{M_n} = \frac{2\pi \cdot n \cdot \Delta kr}{M_n} \quad (19)$$

Figure 5:
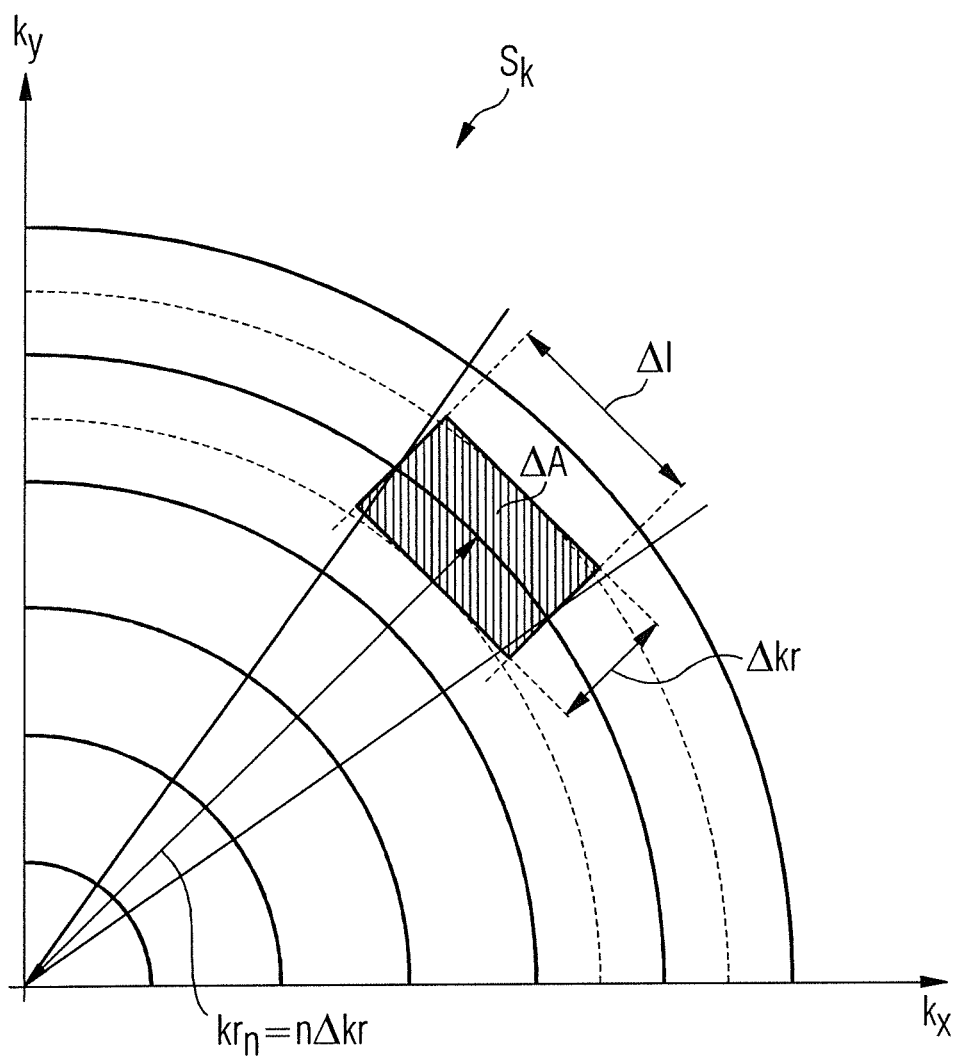
FIG. 5 is a schematic, enlarged depiction of equidistant, concentric ring trajectories in the I-th quadrant of an x/y plane in k-space to explain the density of the trajectories.

As can be seen in FIG. 5 (shaded area), the area $\Delta A$ that is linked with the single sample is simply this length $\Delta l_n$ multiplied by the spacing $\Delta kr$ between two adjacent ring trajectories:

$$\Delta A_n = \Delta l_n \Delta kr \quad (20)$$

The density compensation factor $\rho_n$ for the n-th ring trajectory is thus $$\rho_n = \frac{\Delta l_n}{\Delta A_n} = \frac{l}{\Delta kr} \quad (21)$$

In the examples (equidistant ring spacing) shown in FIGS. (2) and (5), the density compensation factor is thus identical for all partial pulses. Given non-equidistant ring spacing (see for example FIG. 10), for a ring trajectory the radial ring spacing $\Delta kr$ in Formulas (20) and (21) can be approximately replaced by the mean spacing from the two neighboring ring trajectories.

The center of the rotationally symmetrical excitation profile can be displaced by a distance ($\delta x$, $\delta y$) away from the isocenter of the gradient system in that the $b_1$ field is modulated with a phase factor that is linearly proportional to the current gradient moment:

$$b_{1n,complex}(t, \delta x, \delta y) = b_{1n} e^{-2\pi i (k_{x,n}(t) \delta x + k_{y,n}(t) \delta y)} \quad (22)$$

wherein $b_{1n}$ is the time-independent $b_1$ amplitude of the n-th partial pulse for the excitation in the isocenter, and ($k_{x,n}(t)$, $k_{y,n}(t)$) is the wave vector at the point in time t upon traversal of the n-th ring. The RF pulse herein does not differ from known, two-dimensional selective RF pulses in the prior art.

There are various possibilities for the embodiment of a pulse arrangement according to the invention, wherein a two-dimensional selective RF pulse is created by a composition of such partial pulses explained above.

In the simplest embodiment, the partial pulses are simply executed in chronological order. The time interval between the individual pulses can thereby be freely selected in principle. Due to the unavoidable $T_1$ and $T_2$ relaxation of the spins that are affected by an earlier partial pulse, and due to the dephasing of the signal of already excited spins (for example as a result of $B_0$ inhomogeneities during the execution of the later partial pulses), an optimally short duration of the total pulse is preferred in most cases. It is preferably sought to minimize the time periods in which no RF radiation takes place.

Figure 6:
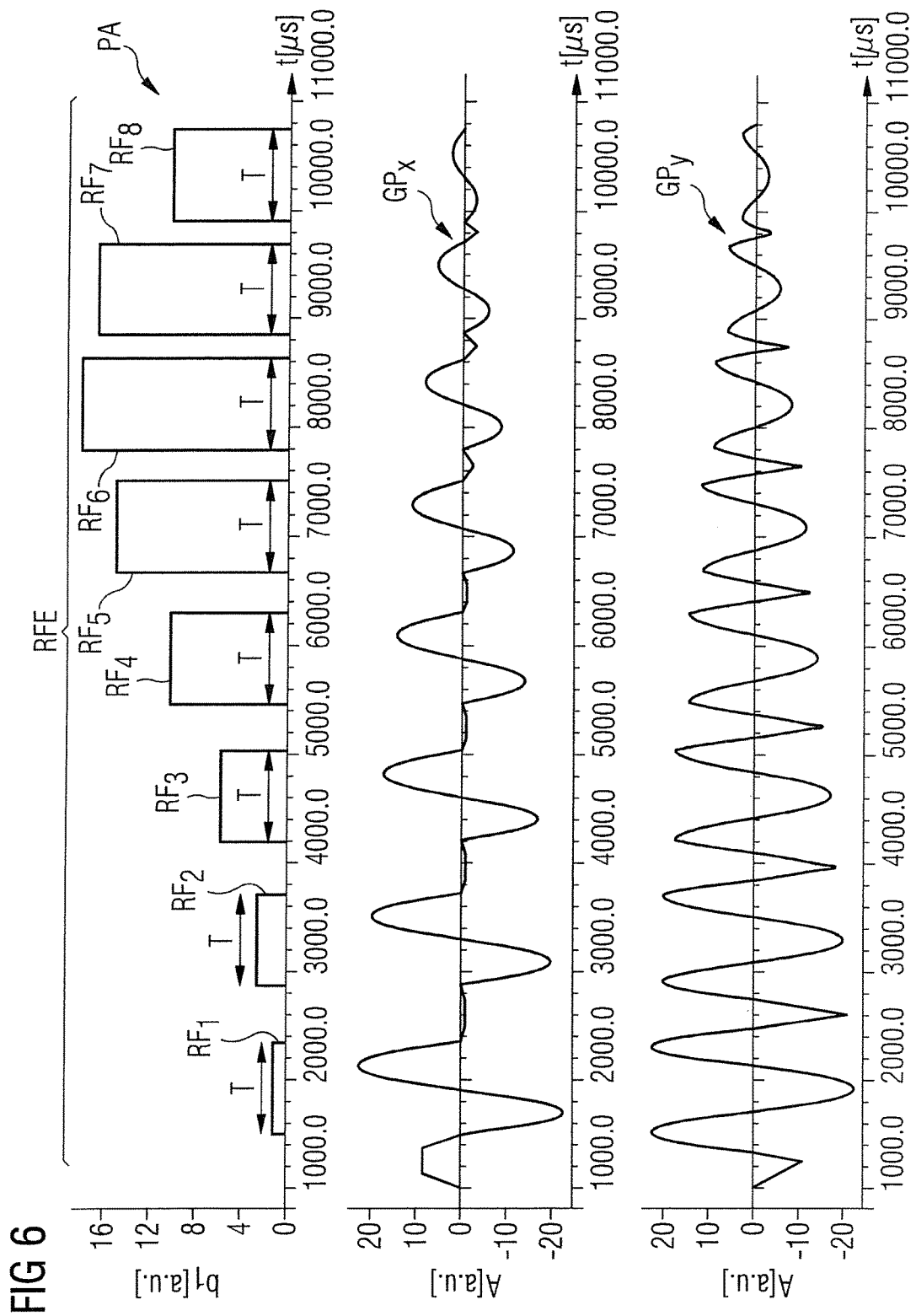
FIG. 6 is a simplified depiction of a pulse diagram of an RF excitation pulse according to a first exemplary embodiment of the method according to the invention.

FIG. 6 shows a pulse diagram of the pulse arrangement PA of a simulation of the two-dimensional selective RF pulse RFE according to the invention, which was used to acquire the image in FIG. 3 (see also in this regard the ring trajectories in FIG. 2), together with the associated gradient pulses $GP_x$, $GP_y$ in the x-direction and y-direction (similar to as in FIG. 4, but now the complete two-dimensional selective RF pulse RFE). The $b_1$ amplitude of the partial RF pulses is shown on the upper axis in arbitrary units ([a.u.]). Shown on the axes located below these are the gradient amplitudes, likewise in arbitrary units. The units of the time axes are respectively μs. The selective RF pulse can be subdivided into eight partial pulses $RF_1, RF_2, RF_3, \ldots, RF_8$. The duration T of the first partial pulse $RF_1$ with maximum k-space radius $kr_{max}$ is chosen to be as short as is possible for given maximum allowable gradient amplitude $G_{max}$ and given maximum allowable gradient slew rate $S_{max}$. The duration T of the additional partial pulses $RF_2, RF_3, \ldots, RF_8$ is not gradient-limited. Rather, the duration T for traversal of all ring trajectories $TR_1, TR_2, TR_3, \ldots, TR_8$ (and therefore the duration T of the respective rectangular RF pulses $RF_1, RF_2, RF_3, \ldots, RF_8$) is chosen the same for all partial pulses. According to the nomenclature given two-dimensional selective spiral pulses, this can be considered as an execution with constant angular velocity ("constant angular rate").

The (constant) amplitudes $b_1$ of the individual rectangular partial pulses $RF_1, RF_2, RF_3, \ldots, RF_8$ were calculated as explained above.

Figure 7:
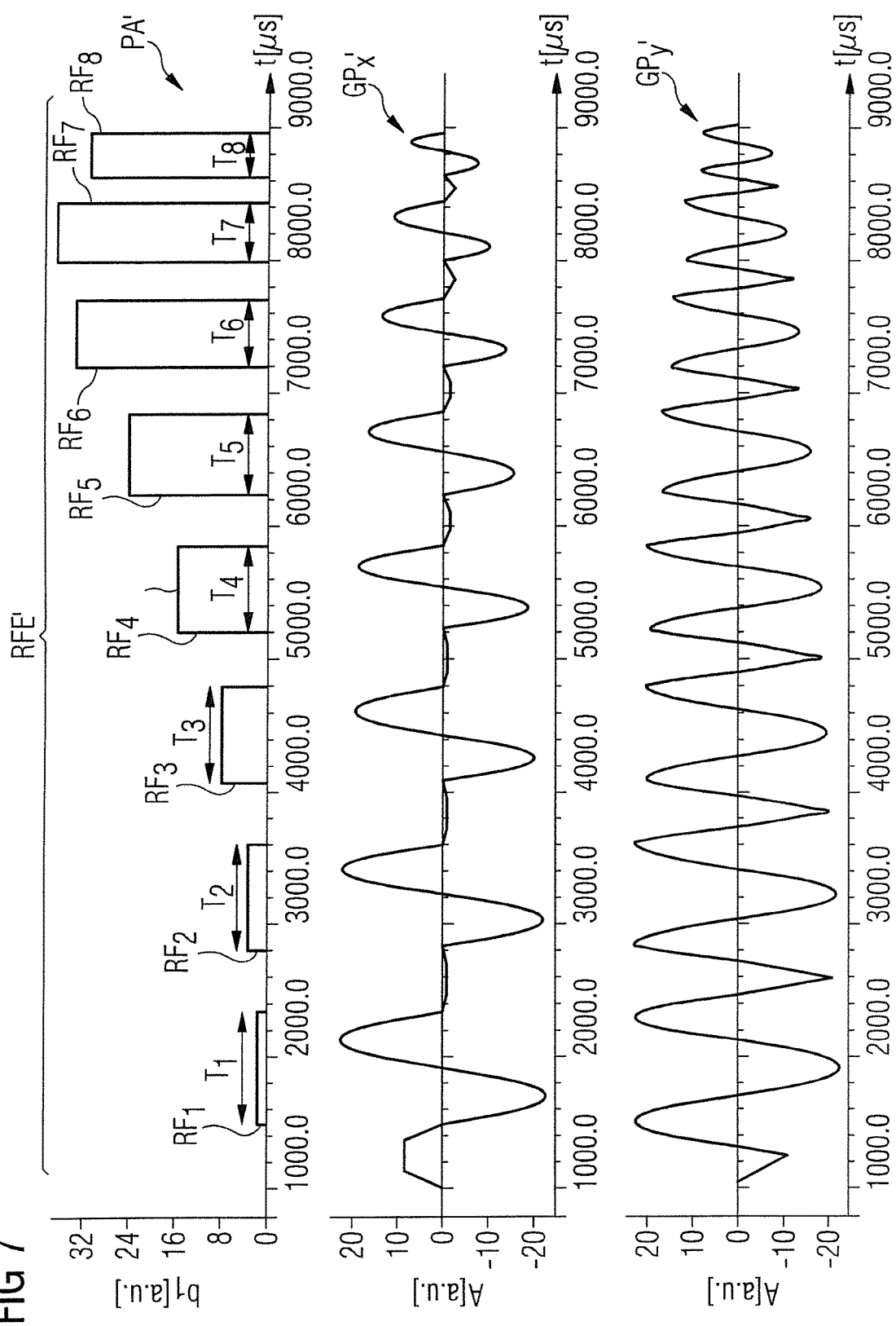
FIG. 7 is a simplified depiction of a pulse diagram of an RF excitation pulse according to a second exemplary embodiment of the method according to the invention.

FIG. 7 shows a corresponding (simulated) pulse diagram of a pulse arrangement (PA') with another embodiment variant of a two-dimensional selective RF pulse RFE' according to the invention, together with the associated gradient pulses $GP_x'$, $GP_y'$ in the x-direction and y-direction. The significant difference relative to the variant according to FIG. 6 is that here the duration $T_1, T_2, T_3, \ldots, T_8$ of each individual pulse $RF_1, RF_2, RF_3, \ldots, RF_8$ was calculated individually, and in fact such that the given maximum allowable gradient amplitude $G_{max}$ and maximum allowable gradient slew rate $S_{max}$ are specifically not exceeded for a given k-space radius $kr_n=(N-n+1)\Delta kr$ of the respective n-th ring trajectory $TR_1, TR_2, TR_3, \ldots, TR_8$. Again in accordance with the nomenclature given two-dimensional selective spiral pulses, this could be designated as an embodiment with constant (gradient) slew rate.

In the two embodiments presented in FIGS. 6 and 7, the rephasing gradients of the n-th partial pulse are respectively merged with the prephasing gradients of the n+1-th partial pulse. Such a combination of two gradients means that, instead of executing the two gradients in chronological order, only one gradient (gradient pulse) is switched whose 0th moment is equal to the sum of the 0th moments of the individual gradients. The goal of the combination is primarily a time savings. An additional advantage of the combination of adjacent gradient pulses is that the gradient noise, eddy currents and the heating of gradient coils and gradient amplifiers can hereby be reduced.

In the embodiment according to FIG. 7, the time intervals $T_1, T_2, T_3, \ldots, T_8$ in which the RF radiation takes place are optimal. Any additional shortening would lead to exceeding the maximum allowable gradient slew rate $S_{max}$ or maximum allowable gradient amplitude $G_{max}$. An additional shortening of the total duration of the two-dimensional selective RF pulse RFE' or, respectively, the total pulse arrangement PA is thus possible only via a shortening of the times without RF radiation during which the rephasing gradients and prephasing gradients are executed.

Figure 8:
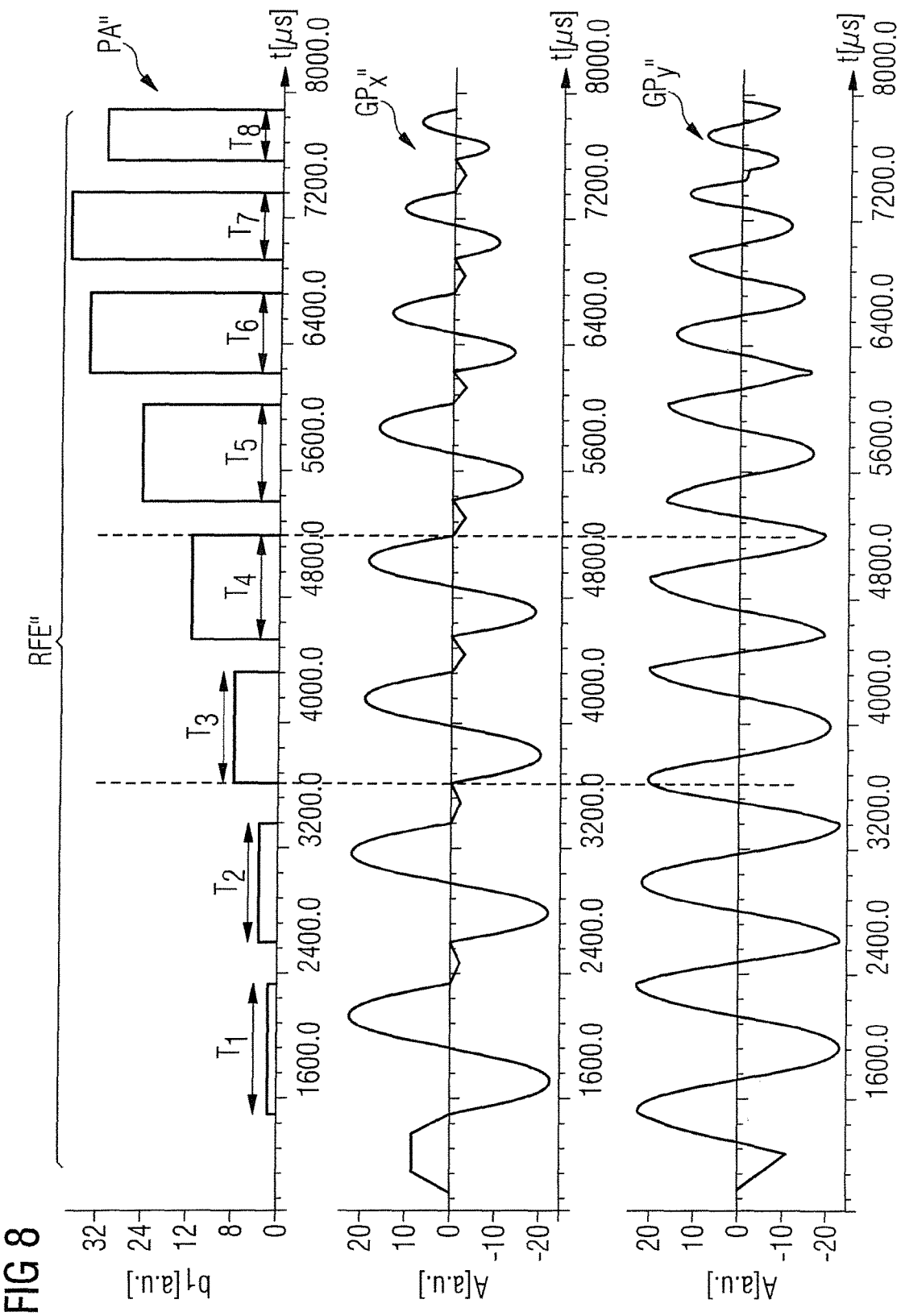
FIG. 8 is a simplified depiction of a pulse diagram of an RF excitation pulse according to a third exemplary embodiment of the method according to the invention.

In this regard, FIG. 8 shows a corresponding (simulated) pulse diagram of a pulse arrangement PA" with an embodiment variant of a two-dimensional selective RF pulse RFE" according to the invention, together with the associated gradient pulses $GP_x"$, $GP_y"$ in the x-direction and y-direction, in which the time between the intervals with RF radiation is again reduced. This is achieved in that adjacent ring trajectories in k-space are traversed with different rotation direction. For example, the rotation direction of the partial pulses with odd index is counter-clockwise, and opposite the clockwise rotation direction of the partial pulses with even index.

Figure 9:
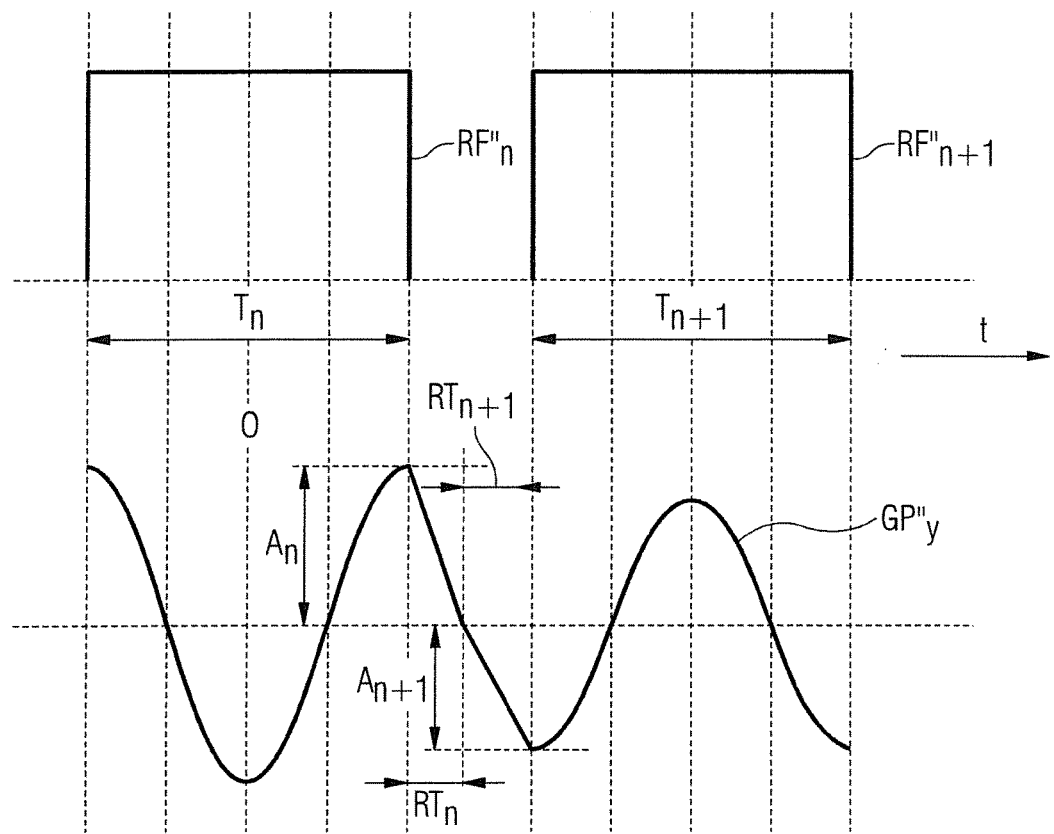
FIG. 9 is an enlarged depiction of portions of the pulse diagram according to FIG. 8.

The advantage of this variant is explained using FIG. 9, which shows an enlarged section of two adjacent partial RF pulses $RF_n"$, $RF_{n+1}"$ and the associated segment of the gradient pulse $GP_y"$ in the y-direction (for example, the partial RF pulses $RF_n"$, $RF_{n+1}"$ that are concretely depicted in FIG. 9 can correspond to the pulses $RF_3$, $RF_4$ in FIG. 8 which lie in the segment characterized by two lines, but the principle applies just as much to all other chronologically successive partial pulses $RF_n"$, $RF_{n+1}"$).

As is apparent in FIG. 9, the y-gradient is composed of two triangular gradients between the time interval $T_n$ and the time interval $T_{n+1}$. The first gradient has an amplitude $A_n$ and a ramp duration $RT_n$; the second gradient has an amplitude $A_{n+1}$ and ramp duration $RT_{n+1}$. The following applies:

$$A_n RT_n + A_{n-1} RT_{n+1} = 0 \qquad (23)$$

The magnitude of the area (i.e. the magnitude of the 0th gradient moment) of the two triangular gradients is thus the same. With this, (static) spins that are located after the n-th excitation pulse in the transversal plane acquire no phase as a consequence of these gradients. The original condition—that the moment of the n-th y-rephasing gradients and of the n+t1-th y-prephasing gradients is respectively zero—can be replaced (given adjacent ring trajectories respectively traveling in opposite directions due to the different polarity of the amplitudes $A_n$ and $A_{n+1}$) by the weaker condition that the total moment of the composite gradient (see Equation (23)) disappears. This is the cause of the additional time gain in this method variant.

Figure 10:
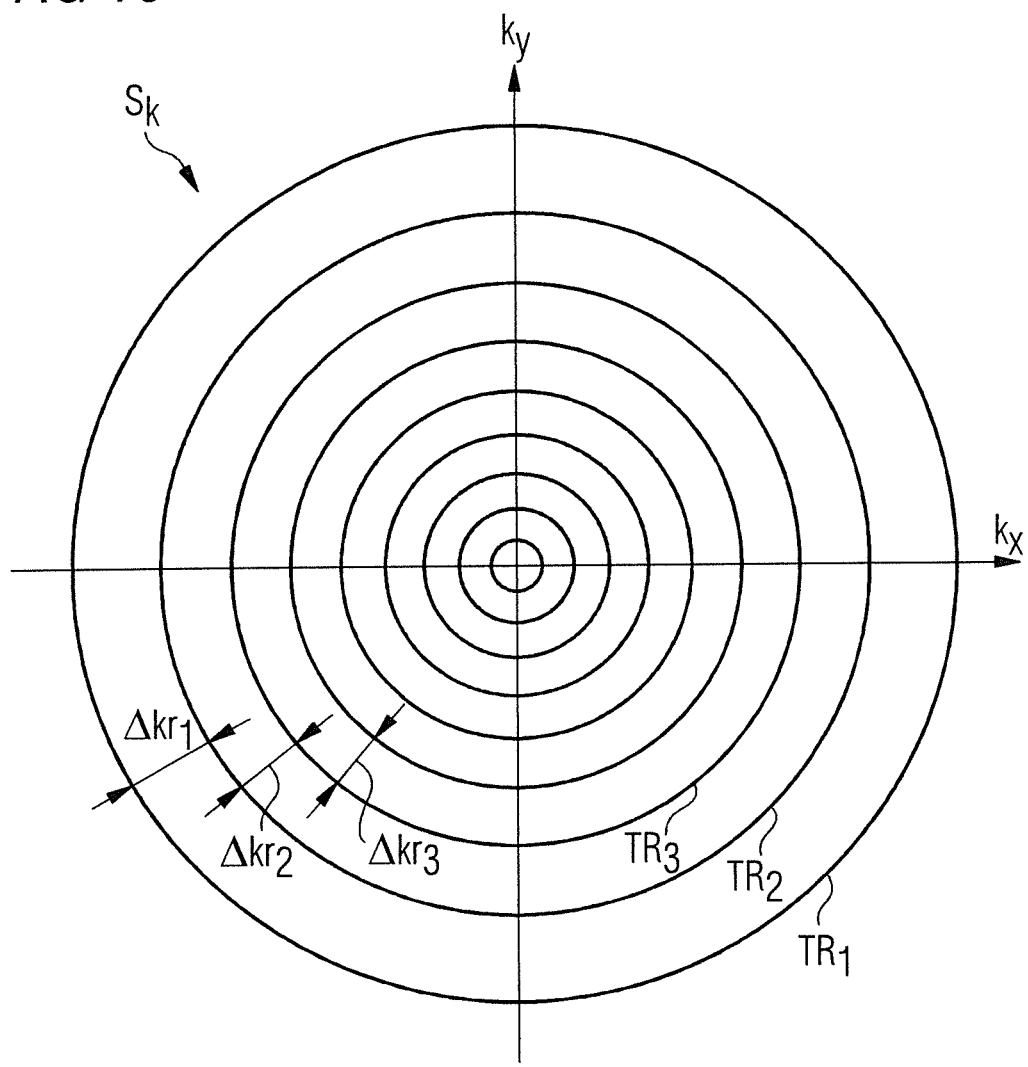
FIG. 10 is a schematic depiction of concentric ring trajectories in an x/y plane in k-space according to a second exemplary embodiment of the invention.

An additional exemplary embodiment of a transmission trajectory in k-space $S_k$ (similar to as in FIG. 2) is shown in FIG. 10. The total transmission trajectory is hereby likewise comprised of concentric ring trajectories around the k-space center. However, the individual ring trajectories $TR_1, TR_2, TR_3, \ldots$ no longer have uniform radial spacings as in the exemplary embodiment according to FIG. 1. Instead of this, the ring spacing $\Delta kr_1, \Delta kr_2, \Delta kr_3, \ldots$ is reduced bit by bit towards the k-space center. In particular, the k-space center can be oversampled, meaning that the ring spacing is chosen to be smaller near the center than the value given by the right side of Formula (8). With a denser scanning of the k-space center, it is to be expected that unwanted excitations are reduced outside of the desired excitation profile P(r). In order to avoid an extension of the total pulse due to the denser scanning of the k-space center, the k-space periphery can be undersampled, meaning that the ring spacing $\Delta kr_1, \Delta kr_2, \Delta kr_3, \ldots$ will be chosen to be greater than required by Formula (8).

Figure 11:
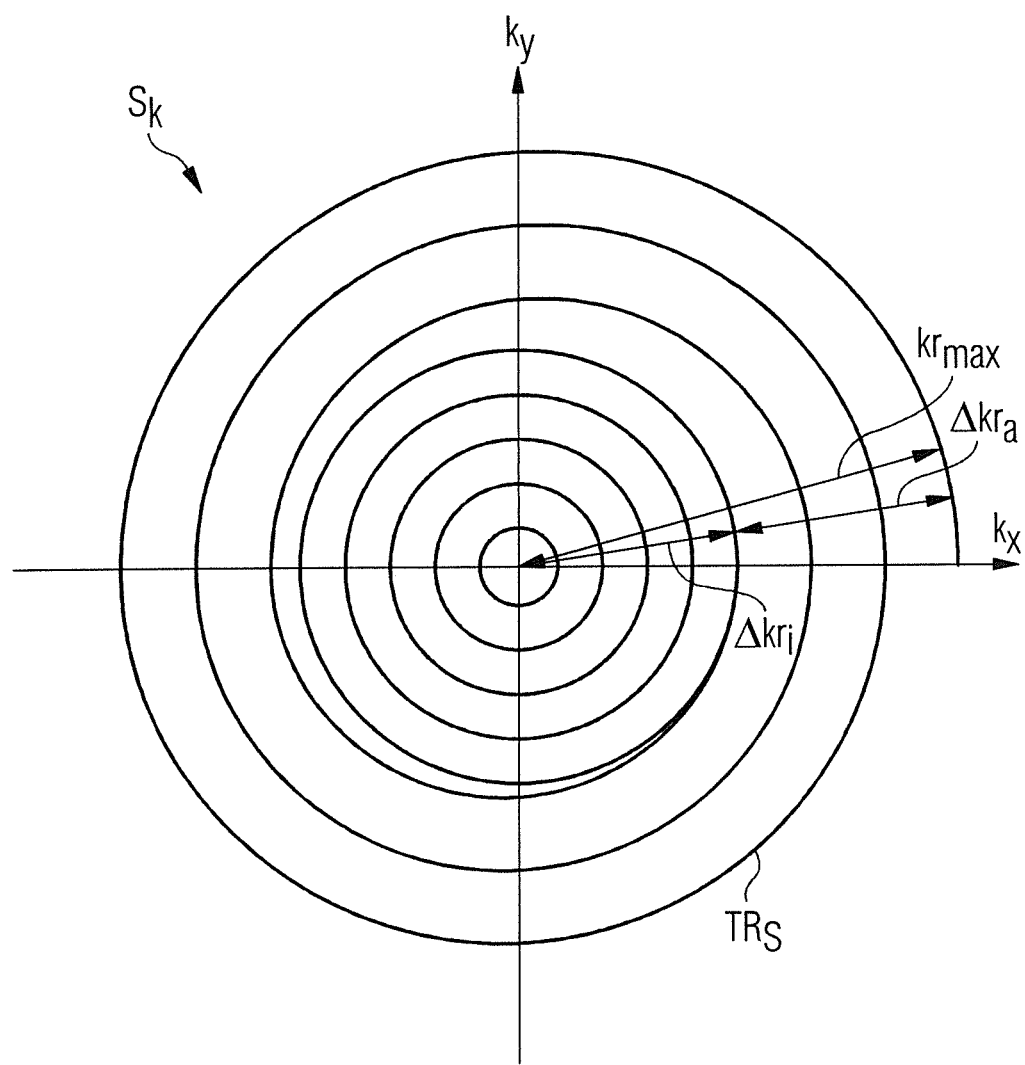
FIG. 11 is a schematic depiction of a trajectory with a spiral-shaped trajectory in the outer region and concentric ring trajectories in the inner region in an x/y plane in k-space, according to a third exemplary embodiment of the invention.

An exemplary embodiment of a transmission trajectory in k-space $S_k$ (similar to as in FIG. 2) that is constructed according to the invention is shown in FIG. 11, wherein only in an inner region of k-space $S_k$ (for example in a radius region $\Delta kr$, up to half of the maximum radius $kr_{max}$) is the transmission trajectory formed from concentric ring trajectories around the k-space center. Instead of this, a spiral trajectory $TR_S$ is used in the peripheral radius region $\Delta kr_a$ of k-space $S_k$. As already presented above and as verified again using tests, the advantage of the concentric ring trajectories relative to conventional spiral trajectories is the greater robustness, in particular with regard to gradient delays. However, one advantage of the spiral trajectory is their quickness. In order to utilize both advantages, in this variant the peripheral regions of excitation k-space are therefore initially traversed with a partial pulse with an (incomplete) spiral trajectory, and subsequently the central regions of k-space are traversed with partial pulses that respectively realize a concentric ring trajectory.

In principle, naturally a reverse arrangement would also be possible, meaning that concentric ring trajectories are to be used outward and a spiral trajectory is to be used inward. However, the variant shown in FIG. 11 is inasmuch advantageous since the information in the peripheral k-space region is less relevant than the information from the k-space center. This is also the reason why the k-space center is always covered last in the other shown variants (see FIGS. 2 and 10).

As shown above, the $b_1$ amplitude of each partial pulse which is radiated on a ring trajectory is constant, which is different than is the case given the known two-dimensional selective RF pulses with EPI or spiral trajectories. An unwanted delay between radiated RF energy and actual applied gradient field therefore leads only to errors right at the beginning of the partial pulse and right at the end of the partial pulse. This leads to an extraordinary robustness of the selection profile given the existence of gradient delay units.

Figure 12:
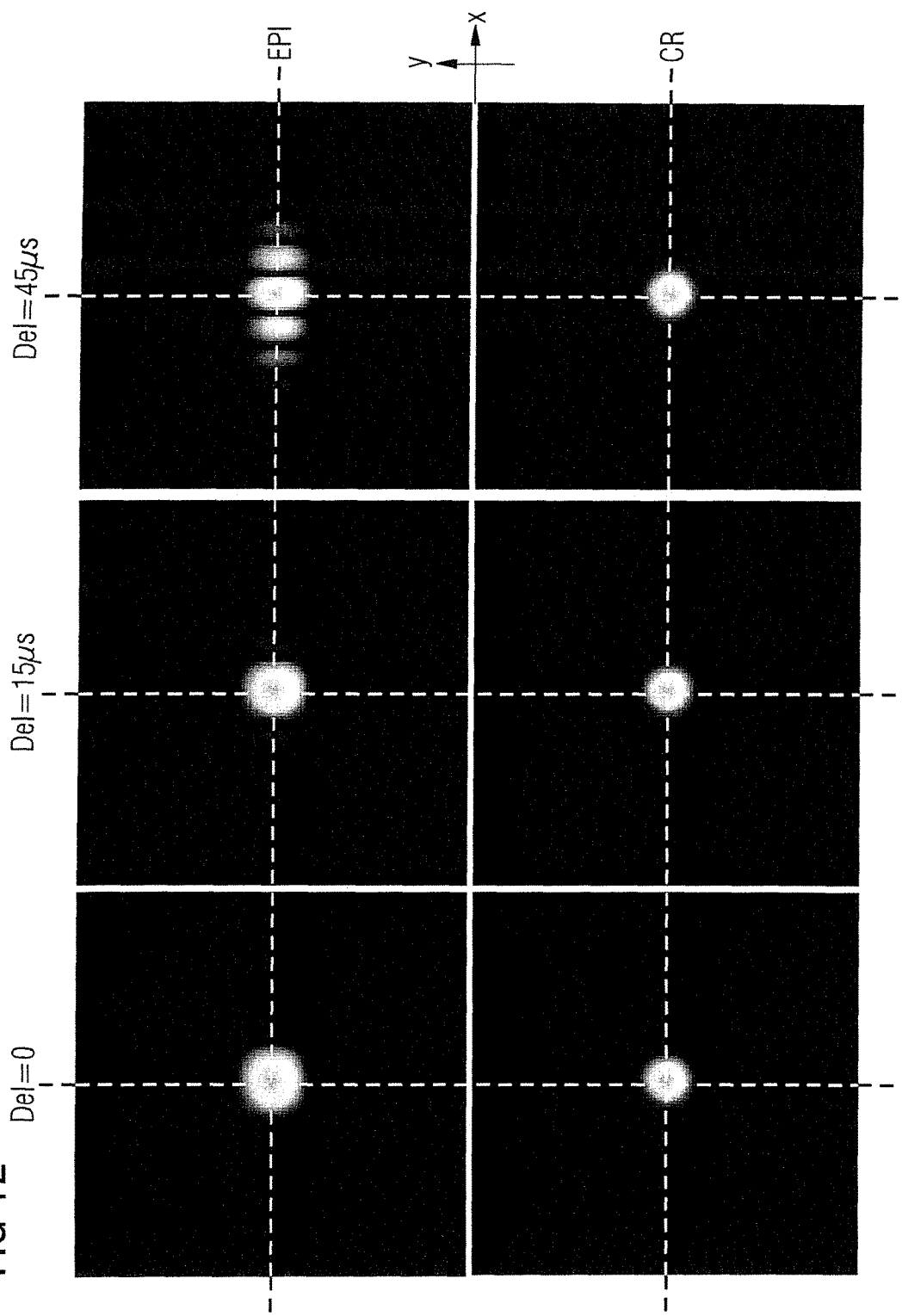
FIGS. 12 through 14 show different slice image exposures of excitations of different excitation profiles given different gradient delay times for comparison, respectively above by means of an EPI excitation and below with a variant of a method according to the invention.
Figure 13:
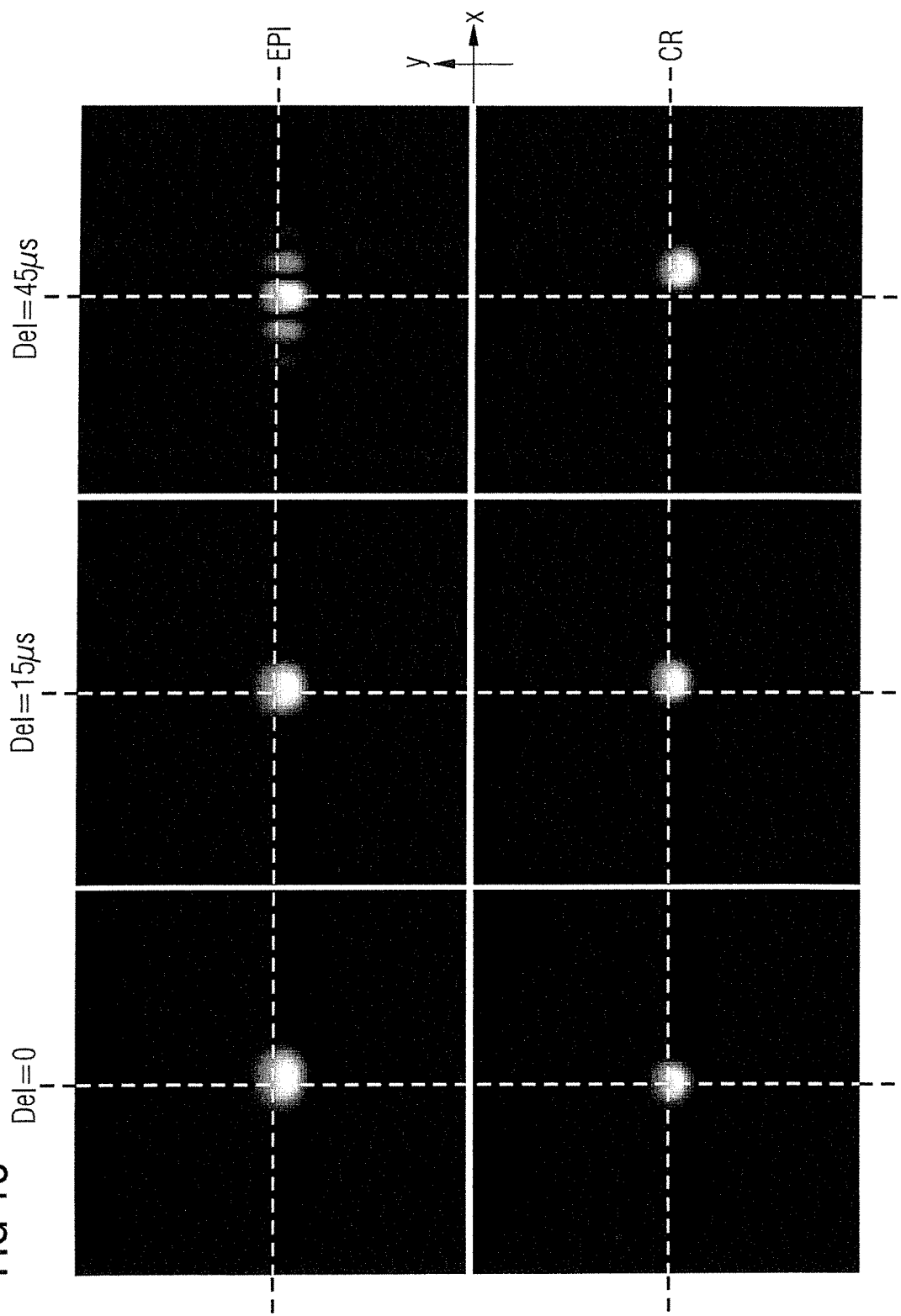
Figure 14:
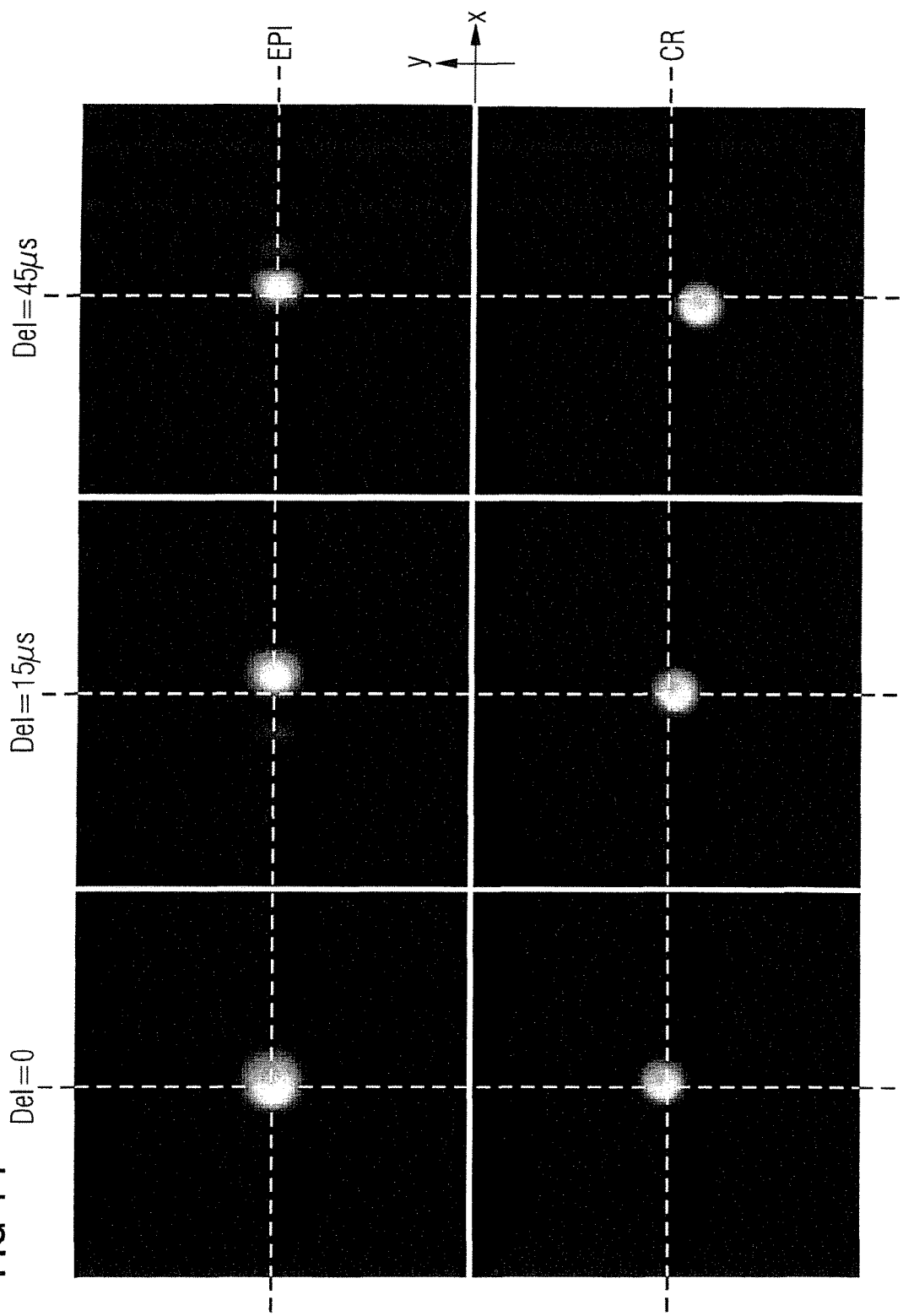

FIGS. 12 through 14 shows an experimental verification of this robustness. For this, in a two-dimensional selective FLASH sequence the excitation pulse is replaced by a two-dimensional selective RF pulse. In the upper row of all three FIGS. 12 through 14, this two-dimensional selective RF pulse is respectively a conventional pulse with EPI trajectory; in the lower row, it is a composite RF pulse with concentric ring trajectories according to the invention.

In all figures, the images in the middle and right column respectively differ from the associated images in the left column in that the radiated RF field has additionally been artificially delayed by 15 µs or 45 µs is relative to the applied gradient field (the delay time is respectively designated with Del). The phantom used in the measurements is a sphere filled with phantom fluid. The clearance of the first lateral band is 128 mm in all cases, and therefore is outside of the phantom.

In all excitations with EPI trajectories the desired excitation profile is a quadratic rod, and given all excitations with concentric ring trajectories the desired excitation profile is respectively a cylinder, in order to respectively adapt the shape of the excitation profile to the basic geometric structure of the trajectories and thus ensure a comparability. The number N of ring trajectories is 8 in the excitation according to the invention, and the diameter of the cylinder is accordingly approximately 32 mm. The parameters of the EPI pulse have been chosen so that the edge length of the quadratic rod is (at least theoretically) likewise 32 mm.

The readout field of view is in all cases respectively 256 mm and oriented orthogonal to the rod axis or, respectively, cylinder axis. The images have been acquired in a Siemens 3T MAGNETOM Verio.

In FIG. 12, the phantom is located in the isocenter of the MR system. In FIGS. 13 and 14, the phantom and the desired location of the excitation have been displaced by 50 mm in the x-direction or, respectively, y-direction. The rod axis or, respectively, cylinder axis in all cases respectively points in the z-direction of the magnet (thus in the direction of the $B_0$ field).

In all three experiments, it is apparent that the profile of the EPI trajectory is significantly disrupted given 15 µs delay time and totally disrupted given 45 µs, while the profile of the concentric ring trajectories is largely maintained. A slight smearing is only apparent at 45 µs.

Given the off-center excitations (FIGS. 13 and 14), the delay time produces a slight displacement of the excitation relative to the desired location (which lies in the middle of the readout field of view). However, this error is harmless in many applications, in particular in a navigator application, since here for example the rod-shaped volume to be excited does not necessarily need to be localized to the dome of the liver (for example) in order to correctly detect the breathing movement.

Furthermore, this property of the method can also advantageously be used to adjust and/or calibrate the delay times. For example, for this an artificially inserted additional delay time could be varied until the measured excitation profile is located precisely at the desired location, and thus the system-inherent (initially unknown) delay time is compensated exactly. Whether this calibration must take place once or in vivo depends on the cause of the delay times.

Figure 15:
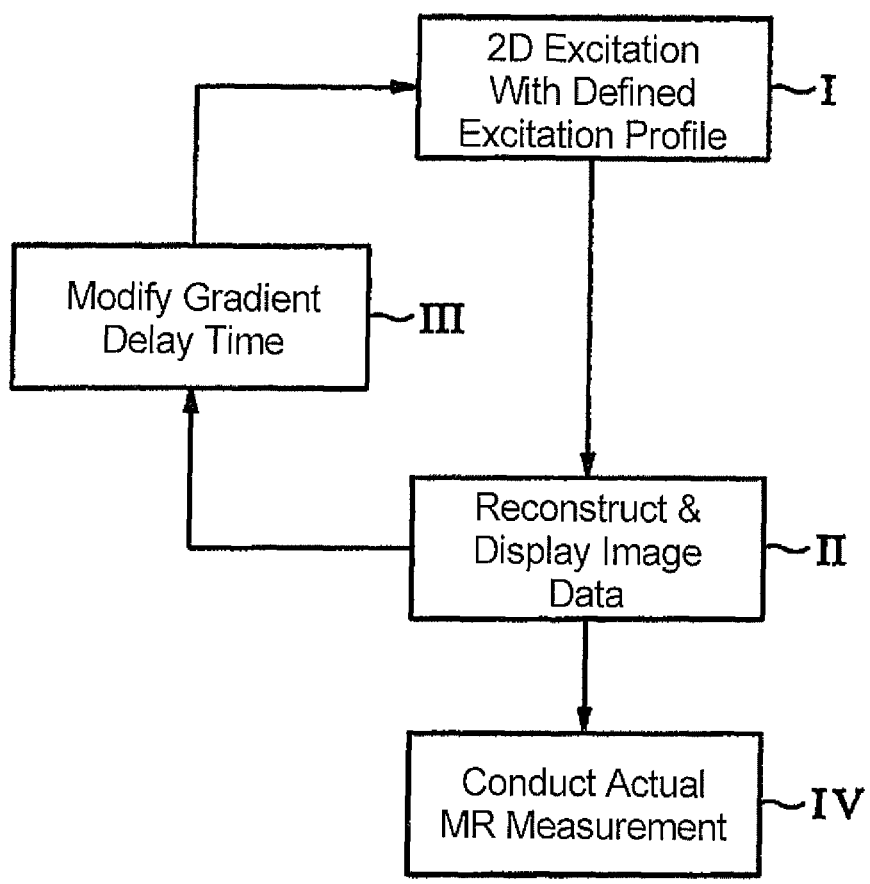
FIG. 15 is an adjustment diagram (flowchart) for an embodiment of a method to calibrate a magnetic resonance system according to the invention.

A simplified flowchart for such a method is schematically presented in FIG. 15. In a step I, a two-dimensional selective excitation of a precisely defined excitation profile initially takes place with the aid of the method according to the invention. In step II, image data reconstructed on the basis of this measurement implemented in step I are subsequently presented to an operator. This operator can then decide whether the excitation profile is located precisely at the desired point. If this is not the case, in step III he artificially modifies the gradient delay time. The gradients can thereby be varied in different spatial directions. In step I, a new measurement is subsequently implemented with identical excitation profile, and the images that are thereby obtained are displayed again in step II. If the operator is satisfied with the result in step II, the magnetic resonance system is adjusted (or, respectively, a calibration has taken place after corresponding protocoling of the values) and the actual measurement can then take place in step IV. Instead of a visual monitoring by an operator, an automatic analysis of the image data can also take place in a more comfortable variant. For example, the position of the excitation profile in the image data can be established with the aid of an image recognition software, and then an adjustment of the gradient delay times can take place automatically based on this in step III etc., until ultimately the delay times are compensated according to the image data.

The method and devices that are described detail herein are exemplary embodiments, and the basic principle can be varied by those skilled in the art without departing from the scope of the invention. For example, instead of being realized at the terminal the control sequence determination device 22 can also be part of the control device 10 itself, in particular can also be components of the measurement control unit 15. The control sequence determination device could likewise also be realized at a separate computer system which, for example, is connected with the magnetic resonance system 1 via the network NW. The terms "unit" and "module" do not preclude these items from being formed by multiple components that can also be spatially distributed.

I claim as my invention:

1. A method for operating a magnetic resonance apparatus, said method comprising:
   in a computerized processor, determining a magnetic resonance control sequence as a radio-frequency (RF) excitation pulse, comprised of a sequence of multiple, partial RF pulses, coordinated with gradient pulses in two spatial directions placed in parallel with said sequence of multiple, partial RF pulses so as to cause said RF excitation pulse to selectively excite nuclear spins in at least two spatial directions to produce a limited, rotationally symmetrical excitation profile within an examination subject;
   in said computerized processor, determining said sequence of multiple, partial RF pulses in order to cause an RF energy introduction of different partial RF pulses, among said sequence of multiple, partial RF pulses, in transmission k-space to respectively occur on circular k-space transmission trajectories that are concentric to each other;
   in said computerized processor, determining an amplitude of an RF envelope of said partial RF pulses to be respectively constant during a duration of traversal of each circular k-space trajectory; and
   in said computerized processor, generating control signals corresponding to the determined magnetic resonance control sequence, with the determined sequence of multiple, partial RF pulses and with the determined RF envelope of said partial RF pulses, and emitting said control signals to said magnetic resonance apparatus in order to acquire magnetic resonance data from a subject.

2. A method as claimed in claim 1 comprising, in said computerized processor, setting the duration of the traversal of the respective circular k-space trajectories to be the same duration for respectively different partial RF pulses among said sequence of multiple, partial RF pulses.

3. A method as claimed in claim 1 comprising, in said computerized processor, determining the duration of the traversal of the respective circular k-space trajectories individually for different partial RF pulses in said sequence of multiple, partial RF pulses.

4. A method as claimed in claim 1 comprising, in said computerized processor, setting the duration of traversal of the respective circular k-space trajectories to be a maximum that causes said gradient pulses not to exceed a predetermined maximum gradient slew rate.

5. A method as claimed in claim 1 comprising, in said computerized processor, determining said gradient pulses in order to cause two of said concentric circular k-space trajectories, respectively associated with temporally adjacent partial RF pulses in said sequence of multiple, partial RF pulses, to be traversed in opposite directions in transmission k-space.

6. A method as claimed in claim 1 comprising, in said computerized processor, determining said gradient pulses in order to cause said circular k-space trajectories to form equidistant rings in transmission k-space.

7. A method as claimed in claim 1 comprising, in said computerized processor, determining said gradient pulses in order to cause said concentric circular k-space trajectory used to form rings having a radial spacing relative to each other that becomes smaller in a direction of the common center of said concentric circular k-space trajectories.

8. A method as claimed in claim 1 comprising, in said computerized processor, selecting a number of said concentric circular k-space trajectories depending on a ratio of a spacing between a first side lobe of the excitation profile to a diameter of said excitation profile.

9. A method as claimed in claim 1 wherein said excitation profile is a cylindrical excitation profile, and comprising, in said computerized processor, determining the amplitude of the envelope of the partial RF pulses in order to cause a target flip angle, produced by said partial RF pulses in said cylindrical excitation profile, to be substantially constant.

10. A method to calibrate a magnetic resonance apparatus, comprising:
    in a computerized processor, determining a magnetic resonance control sequence as a radio-frequency (RF) excitation pulse, comprised of a sequence of multiple, partial RF pulses, coordinated with gradient pulses in two spatial directions placed in parallel with said sequence of multiple, partial RF pulses so as to cause said RF excitation pulse to selectively excite nuclear spins in at least two spatial directions to produce a limited, rotationally symmetrical excitation profile within an examination subject;
    in said computerized processor, determining said sequence of multiple, partial RF pulses in order to cause an RF energy introduction of different partial RF pulses, among said sequence of multiple, partial RF pulses, in transmission k-space to respectively occur on circular k-space transmission trajectories that are concentric to each other;
    in said computerized processor, determining an amplitude of an RF envelope of said partial RF pulses to be respectively constant during a duration of traversal of each circular k-space trajectory;
    in said computerized processor, generating control signals corresponding to the determined magnetic resonance control sequence, with the determined sequence of multiple, partial RF pulses and with the determined RF envelope of said partial RF pulses, and emitting said control signals to said magnetic resonance apparatus in order to repeatedly operate said magnetic resonance apparatus, in a plurality of repetitions, according to said determined magnetic resonance control sequence so as to acquire magnetic resonance image data in each repetition; and
    with said control signals in respective repetitions, changing, from repetition-to-repetition, a gradient delay time associated with said gradient pulses until a gradient delay time is achieved that causes a predetermined quality criterion of said image data to be satisfied.

11. A magnetic resonance apparatus comprising:
    a magnetic resonance data acquisition unit comprising an RF transmission system and a gradient system;
    a computerized processor configured to determine a magnetic resonance control sequence as a radio-frequency (RF) excitation pulse, comprised of a sequence of multiple, partial RF pulses, coordinated with gradient pulses in two spatial directions placed in parallel with said sequence of multiple, partial RF pulses so as to cause said RF excitation pulse to selectively excite nuclear spins in at least two spatial directions to produce a limited, rotationally symmetrical excitation profile within an examination subject;

said computerized processor being configured to determine said sequence of multiple, partial RF pulses in order to cause an RF energy introduction of different partial RF pulses, among said sequence of multiple, partial RF pulses, in transmission k-space to respectively occur on circular k-space transmission trajectories that are concentric to each other;

said computerized processor being configured to determine an amplitude of an RF envelope of said partial RF pulses to be respectively constant during a duration of traversal of each circular k-space trajectory; and said computerized processor being configured to generate control signals corresponding to the determined magnetic resonance control sequence, with the determined sequence of multiple, partial RF pulses and with the determined RF envelope of said partial RF pulses, and to emit said control signals to said magnetic resonance data acquisition unit in order to operate said RF transmission system and said gradient system so as to acquire magnetic resonance data.

12. A non-transitory, computer-readable data storage medium encoded with programming instructions, said storage medium being loaded into a computerized control and evaluation system of a magnetic resonance apparatus, and said programming instructions causing said computerized control and evaluation unit to:

determine a magnetic resonance control sequence as a radio-frequency (RF) excitation pulse, comprised of a sequence of multiple, partial RF pulses, coordinated with gradient pulses in two spatial directions placed in parallel with said sequence of multiple, partial RF pulses so as to cause said RF excitation pulse to selectively excite nuclear spins in at least two spatial directions to produce a limited, rotationally symmetrical excitation profile within an examination subject;

determine said sequence of multiple, partial RF pulses in order to cause an RE energy introduction of different partial RF pulses, among said sequence of multiple, partial RF pulses, in transmission k-space to respectively occur on circular k-space transmission trajectories that are concentric to each other;

determine an amplitude of an RF envelope of said partial RE pulses to be respectively constant during a duration of traversal of each circular k-space trajectory; and generate control signals corresponding to the determined magnetic resonance control sequence, with the determined sequence of multiple, partial RF pulses and with the determined RE envelope of said partial RF pulses, and emit said control signals to said magnetic resonance apparatus in order to operate said magnetic resonance apparatus so as to acquire magnetic resonance data from a subject.

* * * * *